US011066597B2

(12) United States Patent
Jeong et al.

(10) Patent No.: US 11,066,597 B2
(45) Date of Patent: Jul. 20, 2021

(54) INTRABAND TRANSITION-BASED INFRARED DEVICE OF NONSTOICHIOMETRIC QUANTUM DOTS

(71) Applicant: KOREA UNIVERSITY RESEARCH AND BUSINESS FOUNDATION, Seoul (KR)

(72) Inventors: Kwang Seob Jeong, Seoul (KR); Bit Na Yoon, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 339 days.

(21) Appl. No.: 16/090,483

(22) PCT Filed: Mar. 31, 2017

(86) PCT No.: PCT/KR2017/003566
§ 371 (c)(1),
(2) Date: Oct. 1, 2018

(87) PCT Pub. No.: WO2017/171482
PCT Pub. Date: Oct. 5, 2017

(65) Prior Publication Data
US 2019/0119565 A1    Apr. 25, 2019

(30) Foreign Application Priority Data

Apr. 1, 2016   (KR) .......................... 10-2016-0040301

(51) Int. Cl.
*C09K 11/02* (2006.01)
*H01L 31/042* (2014.01)
(Continued)

(52) U.S. Cl.
CPC .......... *C09K 11/025* (2013.01); *C01B 19/007* (2013.01); *C01G 13/00* (2013.01);
(Continued)

(58) Field of Classification Search
CPC . C09K 11/025; C09K 11/892; Y10S 977/826; B82Y 20/00
See application file for complete search history.

(56) References Cited

U.S. PATENT DOCUMENTS 6,344,271 B1 * 2/2002 Yadav et al.
2014/0299772 A1 10/2014 Guyot-Sionnest et al.

FOREIGN PATENT DOCUMENTS

| JP | 2008-297192 A | 12/2008 |
|---|---|---|
| KR | 10-2014-0071812 A | 6/2014 |
| KR | 10-2015-0142840 A | 12/2015 |

OTHER PUBLICATIONS

Jeong et al., "Air-Stable n-Doped Colloidal HgS Quantum Dots", J. Phys. Chem. Lett, 2014, 5, pp. 1139-1143.
(Continued)

*Primary Examiner* — C Melissa Koslow
(74) *Attorney, Agent, or Firm* — Sughrue Mion, PLLC

(57) ABSTRACT

The present disclosure relates to an infrared device using intra-band electron transition of non-stoichiometric quantum dots and, more specifically, to non-stoichiometric quantum dot nanoparticles and an infrared device comprising the nanoparticles, in which the nanoparticles comprise quantum dot cores and nonthiol ligands bonded to the core and emits infrared rays from electron transition between discrete energy levels in the band. The infrared device has an effect of emitting infrared rays, particularly, mid-infrared rays or far-infrared rays, by using the electron transition between discrete energy levels in the band of quantum dots in which the proportion of a metal is higher than that of a chalcogen. In addition, the quantum dots are prepared by containing nonthiol ligands, and thus, compared with a conventional thiol ligand, ligand substitution is very easy while the n-type doping of quantum dots is maintained.

15 Claims, 32 Drawing Sheets

(51) Int. Cl.
  *C01G 13/00* (2006.01)
  *C01B 19/00* (2006.01)
  *C09K 11/89* (2006.01)
  *B82Y 20/00* (2011.01)
  *B82Y 40/00* (2011.01)
  *H01L 31/0352* (2006.01)
  *H01L 33/06* (2010.01)

(52) U.S. Cl.
  CPC .......... *C09K 11/892* (2013.01); *H01L 31/042* (2013.01); *B82Y 20/00* (2013.01); *B82Y 40/00* (2013.01); *C01P 2002/72* (2013.01); *C01P 2002/85* (2013.01); *C01P 2004/04* (2013.01); *C01P 2004/64* (2013.01); *H01L 31/035218* (2013.01); *H01L 33/06* (2013.01); *Y02E 10/50* (2013.01); *Y10S 977/826* (2013.01)

(56) References Cited

OTHER PUBLICATIONS

Wichiansee et al., "Synthesis and optical characterization of infrared emitting mercury sulfide (HgS) quantum dots", J. Mater. Chem., 2011, 21, pp. 7331-7336 (Apr. 4, 2011).

* cited by examiner 2.532841921                     9.581606865

Count: 200        Min: 2.532841921
Mean: 5.696563714    Max: 9.581606865
StdDev: 1.267415084   Mode: 4.882430236 (49)
Bins: 9               Bin Width: 0.783196105

INTRABAND TRANSITION-BASED INFRARED DEVICE OF NONSTOICHIOMETRIC QUANTUM DOTS

CROSS REFERENCE TO RELATED APPLICATIONS

This application is a National Stage of International Application No. PCT/KR2017/003566, filed Mar. 31, 2017, claiming priority based on Korean Patent Application No. 10-2016-0040301, filed Apr. 1, 2016.

TECHNICAL FIELD

The present invention relates to an infrared device using electron transition between quantized energy levels, and more particularly, to quantum dot nanoparticles which comprise quantum dot cores and nonthiol ligands bonded to the core and emit infrared rays from electron transition between discrete energy levels in the band and an infrared device comprising the nanoparticles.

BACKGROUND ART

A quantum dot is a nano-sized semiconductor substance and exhibits quantum confinement effect. When the quantum dot is stimulated by an energy such as light, the quantum dot emits light and a color of the emitted light varies depending on a size of the particle. That is, when the size of the substance is small so that a dimension of the substance is lowered, the property of the substance may vary depending on the dimension due to different electron state density and energy. When the quantum dot absorbs the light from an excitation source to reach an energy exited state, the quantum dot emits energy corresponding to an energy band gap of the quantum dot. Therefore, when a size and a composition of the quantum dot are controlled, an energy band gap is also controlled so that light from an ultraviolet region to a near infrared region may be emitted. However, it is very difficult to emit infrared rays, specifically, mid-infrared rays or far-infrared rays due to a large band gap of the quantum dot.

In the meantime, generally, the quantum dot may be mainly prepared by two ways as follows. One of them is a lithographic method using a light source such as a laser and the other is a chemical wet method in which a precursor material is added to a solvent to grow crystals. Between two ways, according to the chemical wet method which synthesizes the quantum dots, uniformity of the size and the shape of the nanoparticles may be controlled by easier and cheaper processes than that of the lithographic method. Further, a choroidal quantum dot which is passivated with an organic ligand is not aggregated in a solution due to steric hindrance of the organic ligand, maintains a stable structure, and exhibits excellent luminescent characteristics by passivation of surface defects. However, the choroidal quantum dot which is stabilized by a thiol organic ligand of the related art has a disadvantage in that the ligand substitution for photoelectronic applications such as photodetectors and solar cells is not easy.

RELATED ART DOCUMENT

Patent Document (Patent Document 1) Korean Unexamined Patent Application Publication No. 10-2009-0114112

DISCLOSURE

Technical Problem

The present inventors confirm that when discrete electron transition energy in a band of a quantum dot having a proportion of metal which is non-stoichiometrically higher than a proportion of chalcogen is used, infrared rays, particularly, mid-infrared rays or far-infrared rays are emitted, while searching an infrared device, and then complete the present invention.

Therefore, the present invention is directed to providing non-stoichiometric quantum dot nanoparticles which comprise quantum dot cores and nonthiol ligands bonded to the core and emit infrared rays from electron transition between discrete energy levels in the band.

Further, the present invention is directed to providing a producing method of non-stoichiometric colloidal quantum dot nanoparticles comprising nonthiol ligands.

Furthermore, the present invention is directed to providing an infrared device comprising the non-stoichiometric quantum dot nanoparticles.

Technical Solution

An aspect of the present invention provides non-stoichiometric quantum dot nanoparticles which comprise quantum dot cores and nonthiol ligands bonded to the core and emit infrared rays from electron transition between discrete energy levels in the band.

Further, another aspect of the present invention provides a producing method of non-stoichiometric colloidal quantum dot nanoparticles comprising (1) preparing a mercury (Hg) precursor solution by heating a mixture of a mercury (Hg) precursor and nonthiol ligands at 100 to 150° C.; and (2) mixing the mercury (Hg) precursor solution and the chalcogen precursor solution, followed by heating at 40 to 120° C.

Further, another aspect of the present invention provides an infrared device comprising the non-stoichiometric quantum dot nanoparticles.

Advantageous Effects

According to the present invention, an infrared device which emits infrared rays, particularly, mid-infrared rays or far-infrared rays, by using the electron transition between discrete energy levels in the band of quantum dots.

Further, the non-stoichiometric quantum dots are prepared by containing nonthiol ligands so that as compared with thiol ligands of the related art, ligand substitution is very easy while maintaining the n-type doping of quantum dots.

MODE OF THE INVENTION

Figure 1:
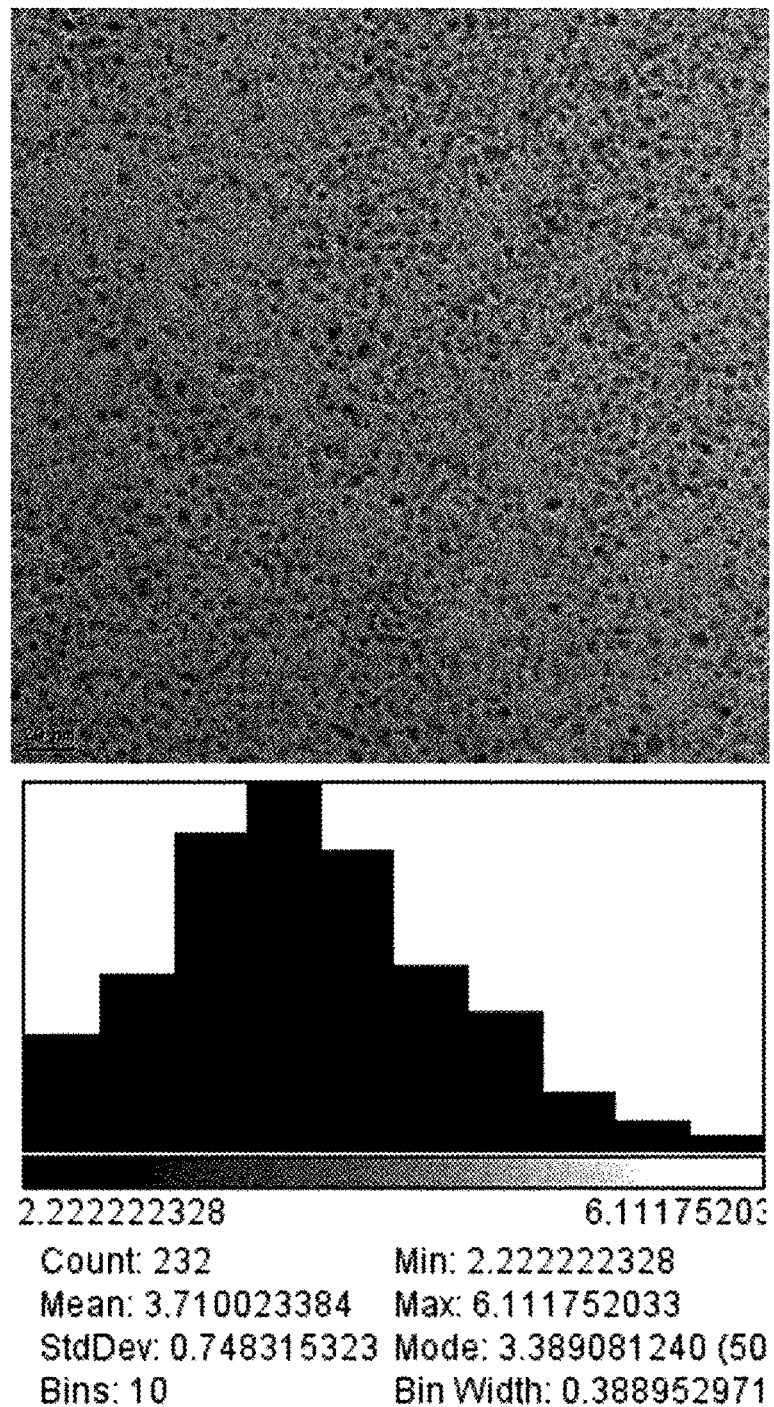
FIG. 1 is a view illustrating a transmission electron microscope (TEM) image and size distribution of non-stoichiometric HgS quantum dots having an average size of 3.7 nm prepared by a method of Example 1-1.
Figure 2:
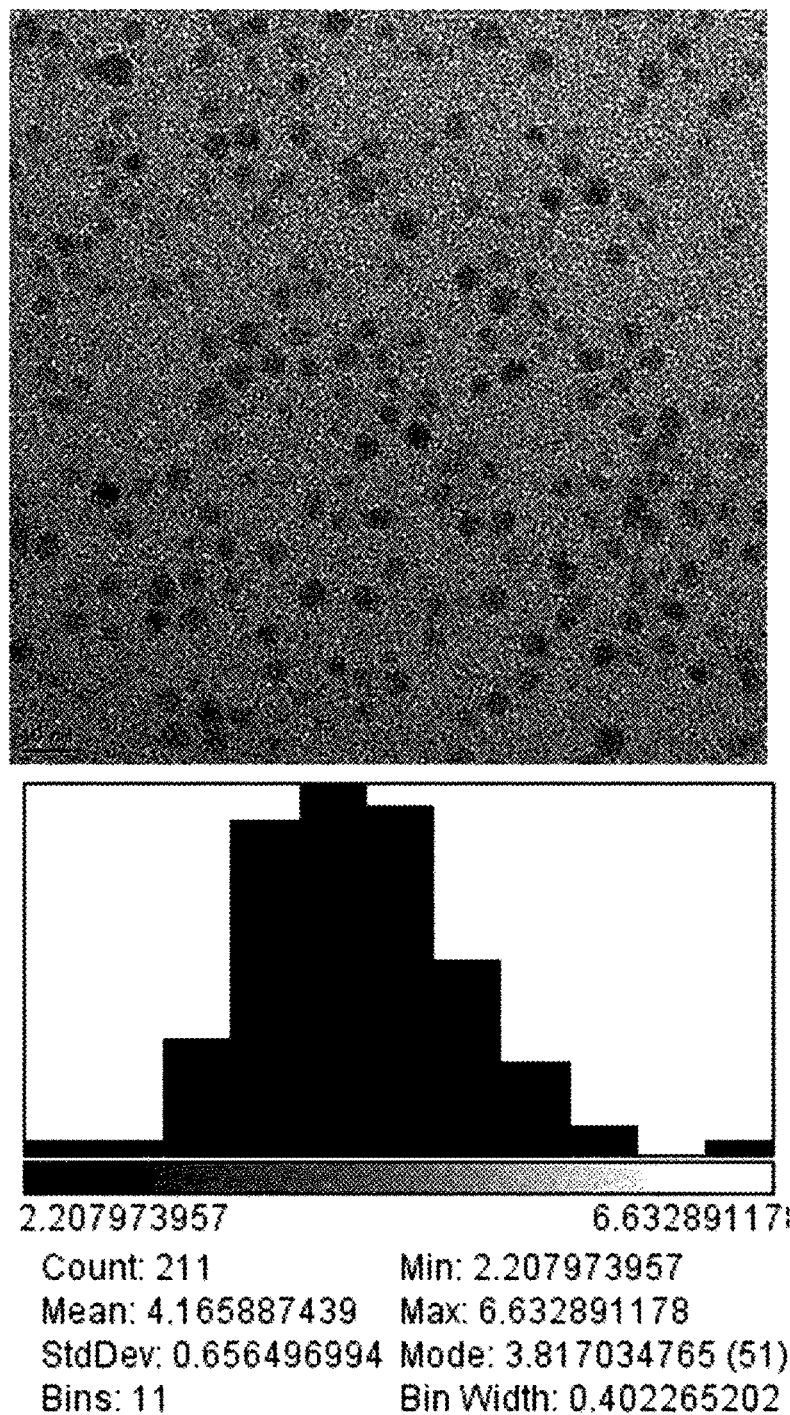
FIG. 2 is a view illustrating a transmission electron microscope (TEM) image and size distribution of non-stoichiometric HgS quantum dots having an average size of 4.2 nm prepared by a method of Example 1-2.
Figure 3:
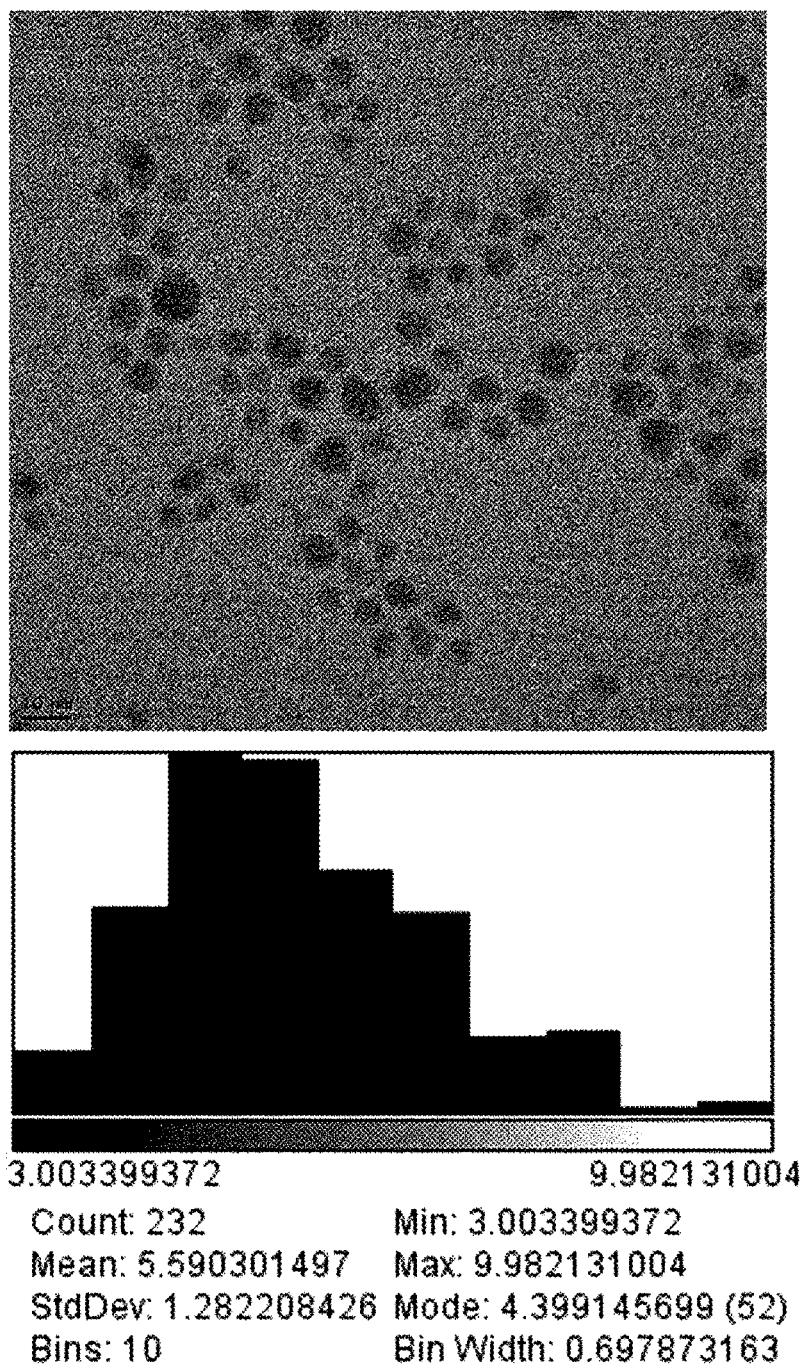
FIG. 3 is a view illustrating a transmission electron microscope (TEM) image and size distribution of nonstoichiometric HgS quantum dots having an average size of 5.6 nm prepared by a method of Example 1-3.
Figure 4:
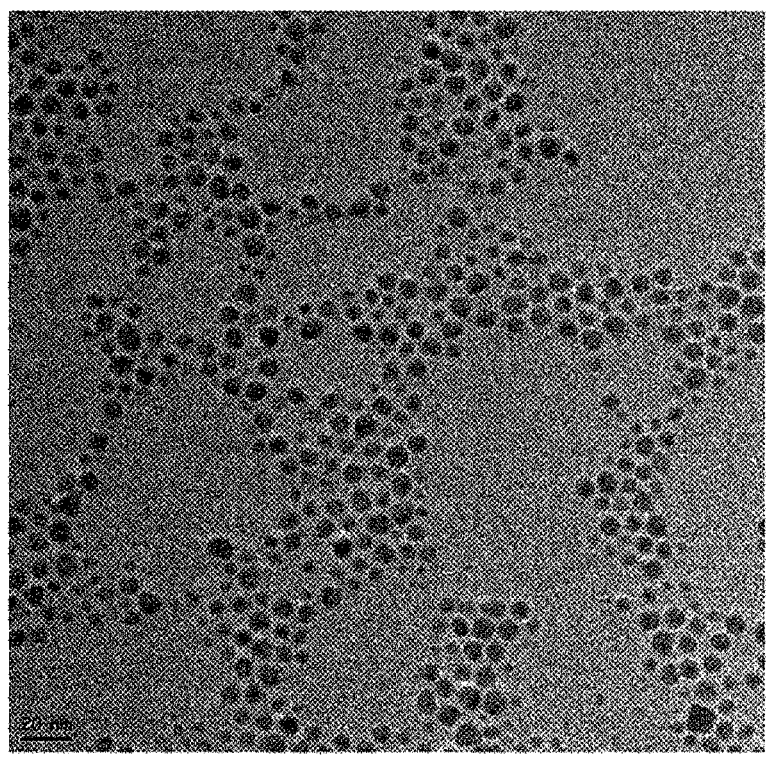
FIG. 4 is a view illustrating a transmission electron microscope (TEM) image and size distribution of non-stoichiometric HgS quantum dots having an average size of 5.7 nm prepared by a method of Example 1-4.
Figure 4:
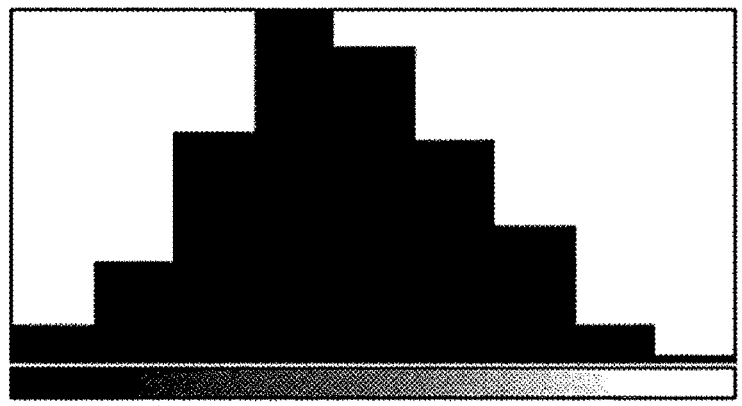
Figure 5:
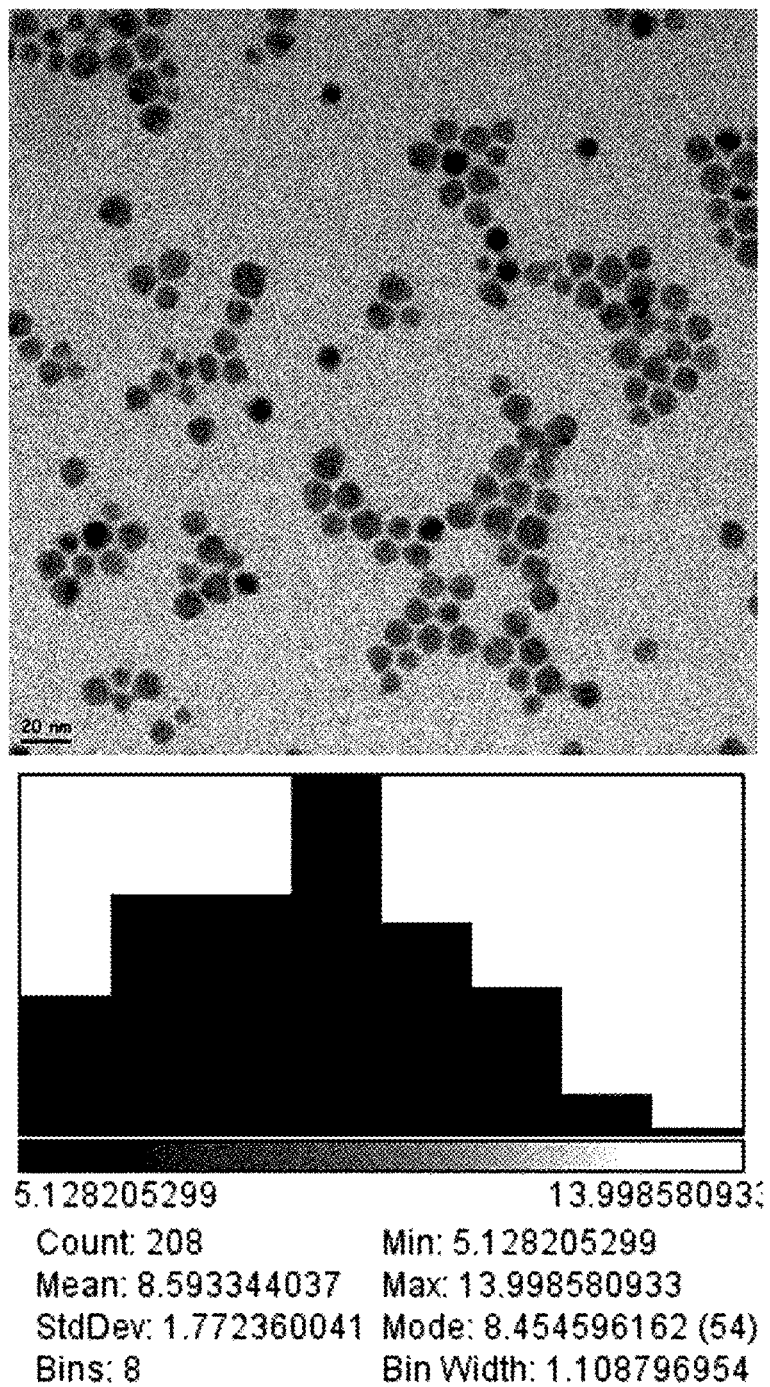
FIG. 5 is a view illustrating a transmission electron microscope (TEM) image and size distribution of non-stoichiometric HgS quantum dots having an average size of 8.5 nm prepared by a method of Example 1-5.
Figure 6:
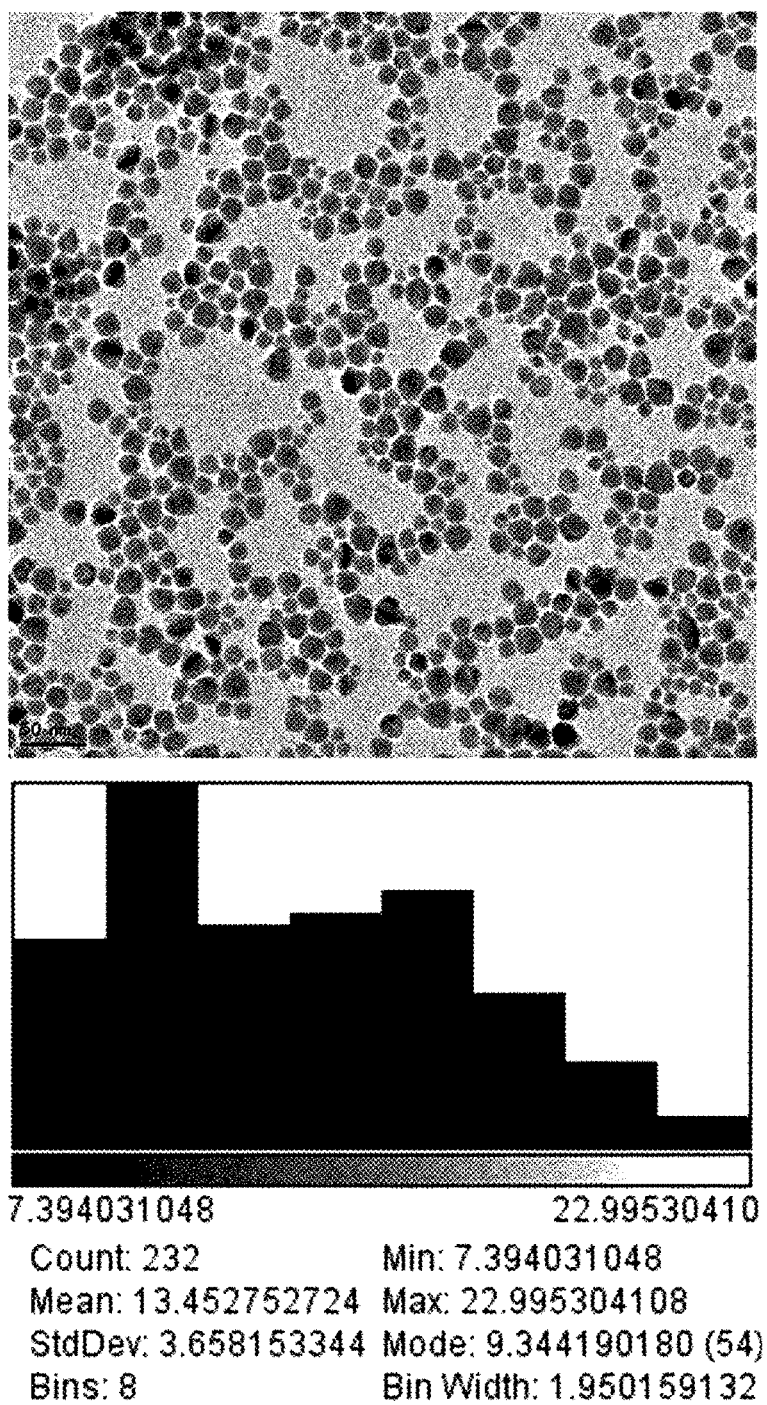
FIG. 6 is a view illustrating a transmission electron microscope (TEM) image and size distribution of non-stoichiometric HgS quantum dots having an average size of 13.4 nm prepared by a method of Example 1-6.
Figure 7:
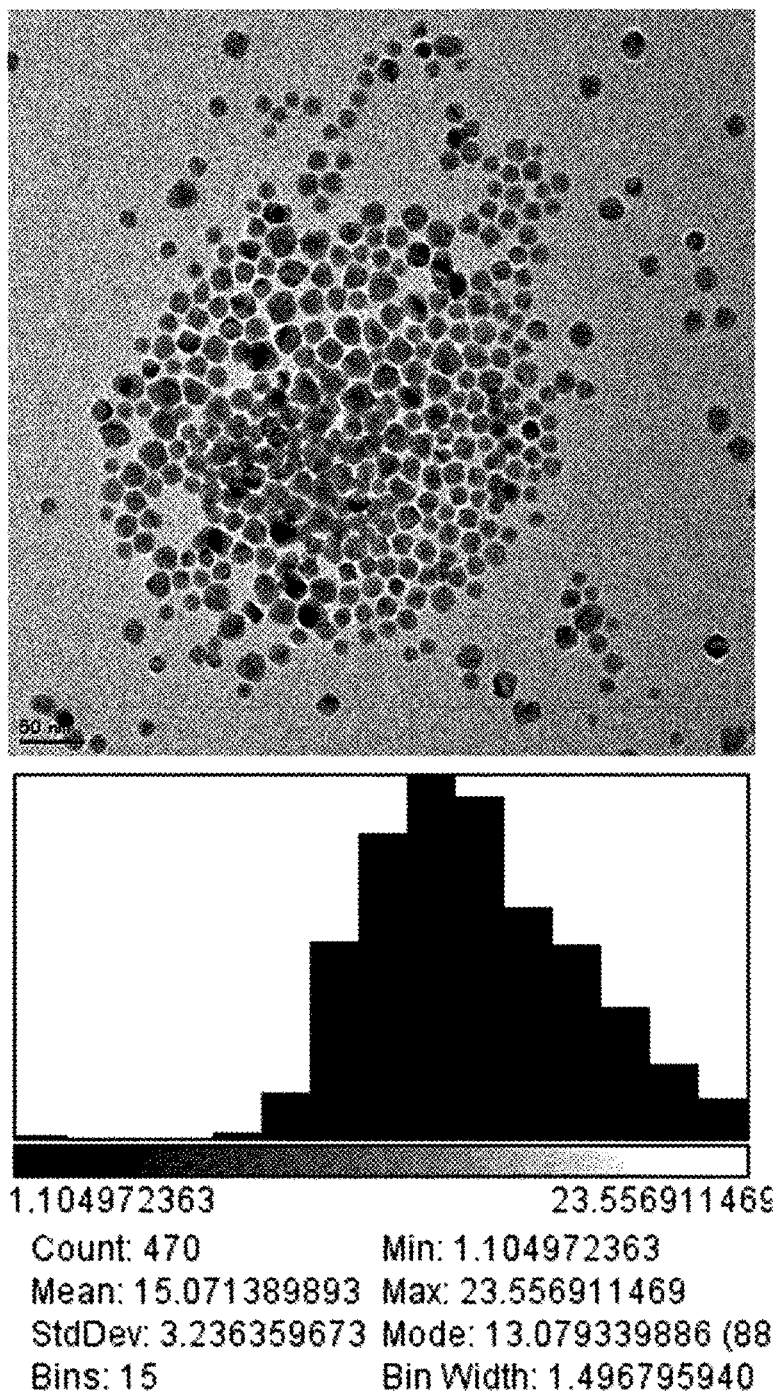
FIG. 7 is a view illustrating a transmission electron microscope (TEM) image and size distribution of non-stoichiometric HgS quantum dots having an average size of 15.1 nm prepared by a method of Example 1-7.
Figure 8:
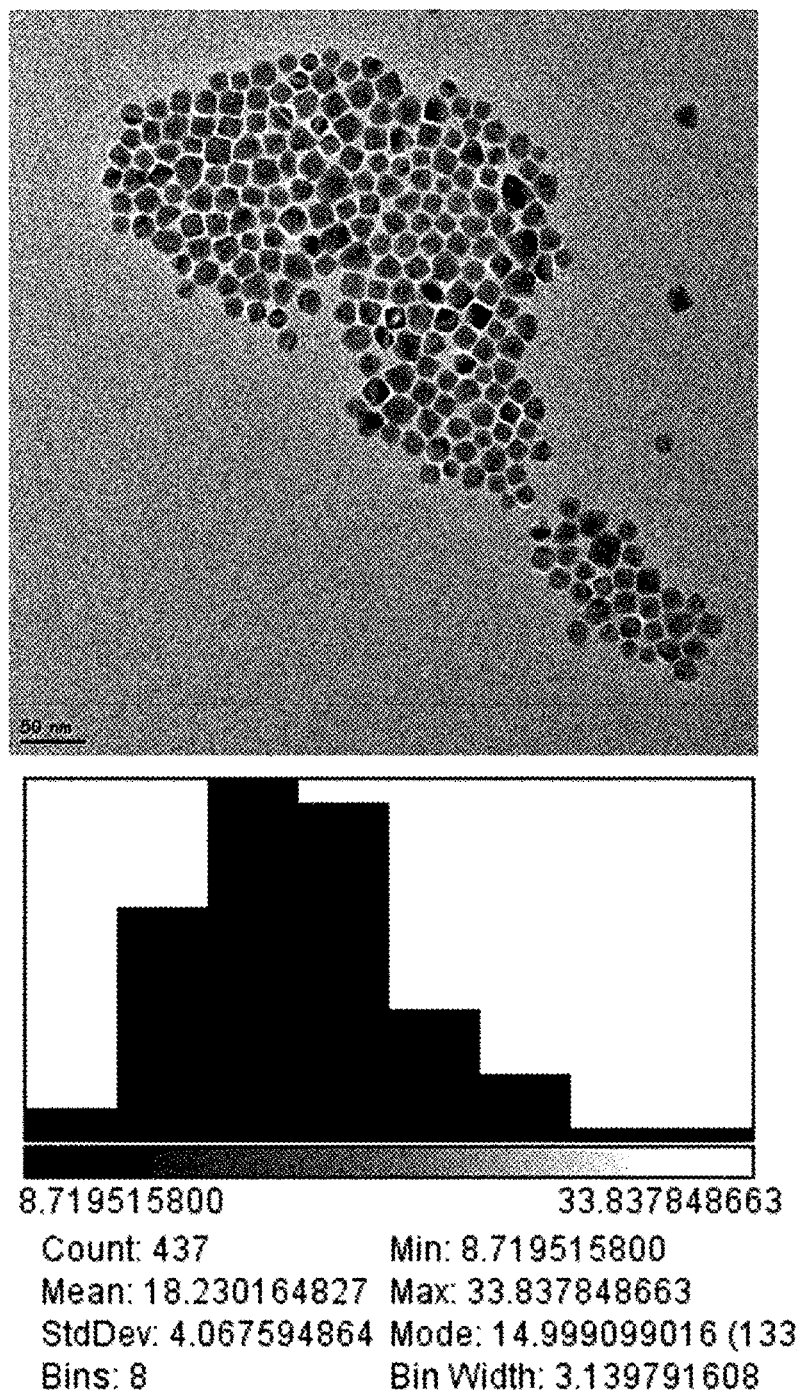
FIG. 8 is a view illustrating a transmission electron microscope (TEM) image and size distribution of non-stoichiometric HgS quantum dots having an average size of 18.2 nm prepared by a method of Example 1-8.

Hereinafter, the present invention will be described in detail.

The present invention provides non-stoichiometric quantum dot nanoparticles which comprise quantum dot cores and nonthiol ligands bonded to the core and emit infrared rays from electron transition between discrete energy levels in the band.

The quantum dot is a nano-sized semiconductor substance and exhibits quantum confinement effect. When the quantum dot absorbs the light from an excitation source to reach an energy excited state, the quantum dot emits energy corresponding to an energy band gap of the quantum dot. Therefore, when the size of the quantum dot is controlled, an energy band gap is controlled so that the light from an ultraviolet region to a near-infrared region may be emitted. However, it is very difficult to emit infrared rays, particularly, mid-infrared rays or far-infrared rays due to a large band gap of the quantum dot.

The quantum dot nanoparticle according to the present invention may emit infrared rays of a specific wavelength, particularly, mid-infrared rays and far-infrared rays, through electron transition between discrete energy levels in a band, rather than electron transition between band gaps.

The nonthiol ligands may be bonded to 1 mol of the core at a molar ratio of 1 to 100.

Further, the energy level state of the quantum dot may be S, P, or D and desirably, may be IS, IP, or ID or higher.

When the size of the quantum dot is controlled, an interval of the discrete energy levels in the band may be controlled.

The discrete energy levels in the band are composed of an energy level filled with electrons and an energy level where electrons are emptied. In this case, when light higher than a gap of the above-described energy levels is applied, the electrons accept the light energy to be excited and leave holes in the place where the electrons escape. In this case, the electrons and the holes are bonded again to generate infrared rays, particularly mid-infrared rays or far-infrared rays.

An average diameter of the quantum dots may be 1 to 20 nm and desirably, may be 3 to 15 nm. In this size, thermal stability and luminous efficiency may be maximized.

Further, as the size of the quantum dot is increased, an infrared ray having a smaller wavenumber may be emitted from the electron transition between the discrete energy levels in the band. According to the exemplary embodiment of the present invention, a quantum dot having an average size of 17 to 19 nm exhibits an emission spectrum of approximately 800 to 1100 $cm^{-1}$ and a quantum dot having an average size of 4 to 6 nm exhibits an emission spectrum of approximately 2100 to 2400 $cm^{-1}$.

The infrared ray may be a mid-infrared ray or far-infrared ray.

The quantum dot may comprise cores and organic or inorganic ligands bonded to the core.

The quantum dot cores may comprise a II-VI group semiconductor compound, a III-V group semiconductor compound, a IV-VI group semiconductor compound, a IV group element or compound, or a combination thereof. Specifically, the non-stoichiometric quantum dot cores may be non-stoichiometric CdS, non-stoichiometric CdSe, non-stoichiometric CdTe, non-stoichiometric ZnS, non-stoichiometric ZnSe, non-stoichiometric ZnTe, non-stoichiometric ZnO, non-stoichiometric HgS, non-stoichiometric HgSe, non-stoichiometric HgTe, non-stoichiometric CdSeS, non-stoichiometric CdSeTe, non-stoichiometric CdSTe, non-stoichiometric ZnSeS, non-stoichiometric ZnSeTe, non-stoichiometric ZnSTe, non-stoichiometric HgSeS, non-stoichiometric HgSeTe, non-stoichiometric HgSTe, non-stoichiometric CdZnS, non-stoichiometric CdZnSe, non-stoichiometric CdZnTe, non-stoichiometric CdHgS, non-stoichiometric CdHgSe, non-stoichiometric CdHgTe, non-stoichiometric HgZnS, non-stoichiometric HgZnSe, non-stoichiometric CdHgZnTe, non-stoichiometric CdZnSeS, non-stoichiometric CdZnSeTe, non-stoichiometric CdZnSTe, non-stoichiometric CdHgSeS, non-stoichiometric CdHgSeTe, non-stoichiometric CdHgSTe, non-stoichiometric HgZnSeS, non-stoichiometric HgZnSeTe, non-stoichiometric HgZnSTe; non-stoichiometric GaN, non-stoichiometric GaP, non-stoichiometric GaAs, non-stoichiometric GaSb, non-stoichiometric AlN, non-stoichiometric AlP, non-stoichiometric AlAs, non-stoichiometric AlSb, non-stoichiometric InN, non-stoichiometric InP, non-stoichiometric InAs, non-stoichiometric InSb, non-stoichiometric GaNP, non-stoichiometric GaNAs, non-stoichiometric GaNSb, non-stoichiometric GaPAs, non-stoichiometric GaPSb, non-stoichiometric AlNP, non-stoichiometric AlNAs, non-stoichiometric AlNSb, non-stoichiometric AlPAs, non-stoichiometric AlPSb, non-stoichiometric InNP, non-stoichiometric InNAs, non-stoichiometric InNSb, non-stoichiometric InPAs, non-stoichiometric InPSb, non-stoichiometric GaAlNP, non-stoichiometric GaAlNAs, non-stoichiometric GaAlNSb, non-stoichiometric non-stoichiometric GaAlPAs, non-stoichiometric GaAlPSb, non-stoichiometric GaInNP, non-stoichiometric GaInNAs, non-stoichiometric GaInNSb, non-stoichiometric GaInPAs, non-stoichiometric GaInPSb, non-stoichiometric InAlNP, non-stoichiometric InAlNAs, non-stoichiometric InAlNSb, non-stoichiometric InAlPAs, non-stoichiometric InAlPSb; non-stoichiometric SnS, non-stoichiometric SnSe, non-stoichiometric SnTe, non-stoichiometric PbS, non-stoichiometric PbSe, non-stoichiometric PbTe, non-stoichiometric SnSeS, non-stoichiometric SnSeTe, non-stoichiometric SnSTe, non-stoichiometric PbSeS, non-stoichiometric PbSeTe, non-stoichiometric PbSTe, non-stoichiometric SnPbS, non-stoichiometric SnPbSe, non-stoichiometric SnPbTe, non-stoichiometric SnPbSSe, non-stoichiometric SnPbSeTe, non-stoichiometric SnPbSTe; Si, Ge, SiC, or SiGe.

The non-stoichiometric quantum dot cores may be mercury chalcogen nanoparticles and the mercury chalcogen may be non-stoichiometric HgS, non-stoichiometric HgSe, or non-stoichiometric HgTe.

The ligand refers to a substance which is bonded to the nanocrystals so as not to aggregate the quantum dots to be fixed and stabilized. Further, the nonthiol ligand is a ligand which does not contain a thiol-group and refers to an organic or inorganic ligand which is bonded to the inorganic center, other than thiol. The choroidal quantum dot which is stabilized by a thiol organic ligand of the related art has a disadvantage in that the ligand substitution for photoelectronic applications such as photodetectors and solar cells is not easy. Therefore, when the nonthiol ligand, particularly, oleic acid or oleylamine is used, it has the advantage of maintaining the n-type doping of quantum dots and simultaneously facilitating ligand substitution.

Specifically, the thiol ligands may be oleic acid, oleylamine, trioctylphosphine (TOP), trioctylphosphine oxide (TOPO), octylamine, trioctyl amine, hexadecylamine, hexylphosphonic acid (HPA), tetradecylphosphonic acid (TDPA), octylphosphinic acid (OPA), and desirably may be oleic acid or oleylamine, but is not limited thereto.

Further, the present invention relates to a producing method of non-stoichiometric colloidal quantum dot nanoparticles comprising (1) a step of preparing a mercury (Hg) precursor solution by heating a mixture of a mercury (Hg) precursor and nonthiol ligands at 100 to 150° C.; and (2) a step of mixing the mercury (Hg) precursor solution and the chalcogen precursor solution, followed by heating at 40 to 120° C.

The producing method may further comprise a step of irradiating light to the non-stoichiometric colloidal quantum dots.

The step (1) is a step of preparing the mercury precursor solution by reacting the mercury (Hg) precursor with non-thiol ligands.

As a quantum dot synthesizing method, vapor deposition methods such as a metal organic chemical vapor deposition (MOCVD) or molecular beam epitaxy (MBE) are used to prepare the quantum dots or a chemical wet method which adds a precursor material to a solvent to grow crystals. According to the chemical wet method, when the crystals are grown, the solvent is naturally coordinated on a quantum dot crystal surface to be served as a dispersant to control the growth of the crystal. Therefore, according to the chemical wet method, uniformity of the size and the shape of the nanoparticles may be controlled by easier and cheaper processes than that of the metal organic chemical vapor deposition (MOCVD) or molecular beam epitaxy (MBE). Further, the quantum dots prepared by the chemical wet process are not used as the undiluted solution and a predetermined ligand is coordinated around the qua MCI dots for stabilization or convenience of use of the quantum dots.

Specifically, the nonthiol ligands may be oleic acid, oleylamine, trioctylphosphine (TOP), trioctylphosphine oxide (TOPO), octylamine, trioctyl amine, hexadecylamine, hexylphosphonic acid (HPA), tetradecylphosphonic acid (TDPA), octylphosphinic acid (OPA), and desirably may be oleic acid or oleylamine, but is not limited thereto.

The nonthiol ligands may be used at a molar ratio of 1 to 100 with respect to 1 mol of mercury (Hg). Therefore, when the used amount is less than 1 mol, the fixing effect of the quantum dots after the synthesis of the quantum dots is markedly deteriorated. As a result, the quantum effect is lost due, to aggregation of the quantum dots in the solution and the effect of adding the ligand is reduced by half. Further, when the used amount exceeds 100 mol, the quantum dots may be re-aggregated due to the lowering of solubility.

Such a reaction is performed by a method which is widely known in the field of the present invention. In the present invention, the reaction may be performed under a reaction condition at 100 to 150° C. for 0.5 to 1.5 hours. When the reaction is performed out of the above condition, a solubility of a raw material is lowered or a solvent is evaporated so that a yield of the quantum dots is lowered. Therefore, it is desirable to maintain the above range.

In step (2), the mercury (Hg) precursor solution and chalcogen precursor solution are mixed and then heated at 40 to 120° C. to produce a colloidal quantum dot. As the chalcogen, S, Se, or Te is desirably used.

The chalcogen is dissolved using a high boiling solvent, and a boiling point of the solvent is maintained in the range of 200 to 350° C. When the boiling point of the solution is lower than 200° C., the solubility of the chalcogen is low and the boiling point of the solution exceeds 350° C., it is not easy to select a solvent. The solvent may be octadecene, octadecylamine, hexadecene, pentadecene, tetradecene, octadecadiene, hexadecadiene, tetradecadiene, phenylether, diphenyl, paraffin, oleic acid, or hexadeca e, but is not limited thereto.

The mercury (Hg) may be mixed at a molar ratio of 1 to 10, preferably 1 to 5, with respect to 1 mol of the chalcogen. When the used amount of the mercury (Hg) is lower than 1 mol, a yield of quantum dot is lowered and a characteristic of emitting in-band transition infrared ray having a specific wavelength is not exhibited. When the amount exceeds 5 mol, an amount of unreacted chalcogen is increased. However, the use of a little excess of mercury (Hg) is advantageous for non-stoichiometric quantum dot synthesis which emits infrared rays, so that it is preferable to maintain the above range.

In this case, the reaction is performed at 10 to 250° C., desirably, at 40 to 120° C. which is significantly lower than 300 to 350° C. which is a quantum dot preparing temperature of the related art. However, when the reaction temperature is lower than 40° C., the quantum dot is not prepared and the reaction temperature exceeds 120° C., the quantum dot is excessively grown so that the quantum effect cannot be achieved.

Further, the present invention relates to an infrared device comprising the non-stoichiometric quantum dot nanoparticles.

The infrared device may be used for a device which emits infrared rays, particularly mid-infrared rays or far-infrared rays. Specifically, the infrared device may be an infrared camera, an infrared detector, an infrared therapy device, an infrared communication device, an infrared solar cell, an infrared LED, an infrared laser, a gas sensor, or an infrared color filter, but is not limited thereto.

EXAMPLES

Hereinafter, preferred embodiments will be suggested for better understanding of the present invention. However, the following embodiments are provided only for more understanding the present invention, and thus the present invention is not limited thereto.

Example 1. Preparation of Non-Stoichiometric HgS Quantum Dot

Example 1-1

A mercury (Hg) precursor solution was prepared by dissolving 550 mg (2 mmol) of $HgCl_2$ in 16 ml (48 mmol) of oleylamine and then being dehydrated in vacuum and heated at approximately 120° C. for one hour.

Simultaneously, a sulfur (S) precursor solution was prepared in another container by dissolving 0.57 mmol of thioacetamide or bis (trimethyisilyl) sulfide in octadecene or octadecylamine.

Thereafter, the mercury (Hg) precursor solution and the sulfur (S) precursor solution were mixed and the mixture was heated at approximately 60° C. In this case, the reaction time was controlled to 32 minutes to adjust a size of the prepared quantum dot to be 3.7 nm. Non-stoichiometric HgS quantum dots were prepared by injecting 10 ml of a nonpolar solvent of tetrachloroethylene or chloroform containing oleylamine into the reaction mixture and cooling to room temperature using cooling water to terminate the reaction.

Examples 1-2 to 1-18

Non-stoichiometric HgS quantum dots having various sizes were prepared by using the same method as Example 1-1 and adjusting used amounts of $HgCl_2$, oleylamine, and sulfur precursor and reaction temperatures and times as represented in Table 1.

TABLE 1

| Example | Size of Non-stoichiometic HgS quantum dot (nm) | HgCl₂ mg | HgCl₂ mmol | Oleylamine ml | Oleylamine mmol | S precursor (mmol) | Temp. (° C.) | Reaction Time (min) |
|---|---|---|---|---|---|---|---|---|
| 1-2 | 4.2 | 160 | 0.6 | 8 | 24 | 0.086 | 90 | 16 |
| 1-3 | 5.6 | 550 | 2 | 16 | 48 | 0.6 | 70 | 32 |
| 1-4 | 5.7 | 80 | 0.3 | 8 | 24 | 0.045 | 110 | 32 |
| 1-5 | 8.5 | 80 | 0.3 | 8 | 24 | 0.178 | 70 | 4 |
| 1-6 | 13.4 | 40 | 0.15 | 4 | 12 | 0.086 | 80 | 32 |
| 1-7 | 15.1 | 40 | 0.15 | 4 | 12 | 0.270 | 120 | 4 |
| 1-8 | 18.2 | 40 | 0.15 | 4 | 12 | 0.356 | 120 | 4 |
| 1-9 | 2.3 | 40 | 0.15 | 4 | 12 | 0.023 | 70 | 16 |
| 1-10 | 4.5 | 80 | 0.15 | 8 | 24 | 0.045 | 90 | 32 |
| 1-11 | 7.0 | 80 | 0.3 | 8 | 24 | 0.057 | 120 | 32 |
| 1-12 | 8.6 | 40 | 0.3 | 4 | 12 | 0.106 | 110 | 4 |
| 1-13 | 14.2 | 40 | 0.15 | 4 | 12 | 0.356 | 110 | 4 |
| 1-14 | 2.3 | 40 | 0.15 | 4 | 12 | 0.029 | 70 | 4 |
| 1-15 | 4.5 | 160 | 0.6 | 8 | 24 | 0.086 | 90 | 16 |
| 1-16 | 4.5 | 550 | 2 | 16 | 48 | 0.407 | 70 | 32 |
| 1-17 | 4.9 | 80 | 0.3 | 8 | 24 | 0.045 | 90 | 32 |
| 1-18 | 5.6 | 80 | 0.3 | 8 | 24 | 0.045 | 110 | 32 |

Example 2. Preparation of Non-Stoichiometric HgSe Quantum Dot

Non-stoichiometric HgSe quantum dots were prepared by the same method as Example 1 except that a selenium (Se) precursor was used instead of the sulfur (S) precursor in Example 1.

Example 3. Preparation of Non-Stoichiometric HgTe Quantum Dot

Non-stoichiometric HgTe quantum dots were prepared by the same method as Example 1 except that a tellurium (Te) precursor was used instead of the sulfur (S) precursor in Example 1.

Example 4. Measuring of Infrared Emission of Quantum Dot

An intensity of infrared fluorescence emitted from the quantum dot by irradiating ultraviolet, visible or infrared light sources to the HgS, HgSe or HgTe quantum dots prepared in Examples 1 to 3.

Example 5. Quantum Dot in-Band Transition Infrared Device which Adjusts Transmittance of Specific Wavelength An infrared device which reversibly controls a transmittance of a specific wavelength in accordance with an applied voltage was manufactured by coating the non-stoichiometric HgS, non-stoichiometric HgSe, or non-stoichiometric HgTe quantum dots prepared in Examples 1 to 3 on a chrome electrode in the form of a film. In this case, in order to apply the voltage to the quantum dots, the oleylamine ligand was substituted with a ligand in which a length of carbon is short and an electrolyte was 0.1 M tetrabutylammonium perchlorate. The transmittance of a specific wavelength was controlled by measuring the amount of change of the light reflected after interaction of the light incident on the voltage-applied quantum dot film and the substance.

Characteristic Analysis

Experimental Example 1. Analysis of Optical and Morphological Characteristic of Quantum Dots Transmission electron microscope (TEM) images and size distributions of non-stoichiometric HgS quantum dots having average sizes of 3.7 nm, 4.2 nm, 5.6 nm, 5.7 nm, 8.5 nm, 13.4 nm, 15.1 nm, and 18.2 nm which were prepared by the methods of Examples 1-1 to 1-8 were illustrated in FIGS. 1 to 8.

All the prepared non-stoichiometric HgS quantum dots form nanocrystals. In the case of a quantum dot having an average size of 18.2 nm, a size distribution was 8.7 to 33.8 nm and a standard deviation was 4.0 nm and in the case of a quantum dot having an average size of 3.7 nm, a size distribution was 2.2 to 6.1 nm and a standard deviation was 0.7 nm.

Figure 9:
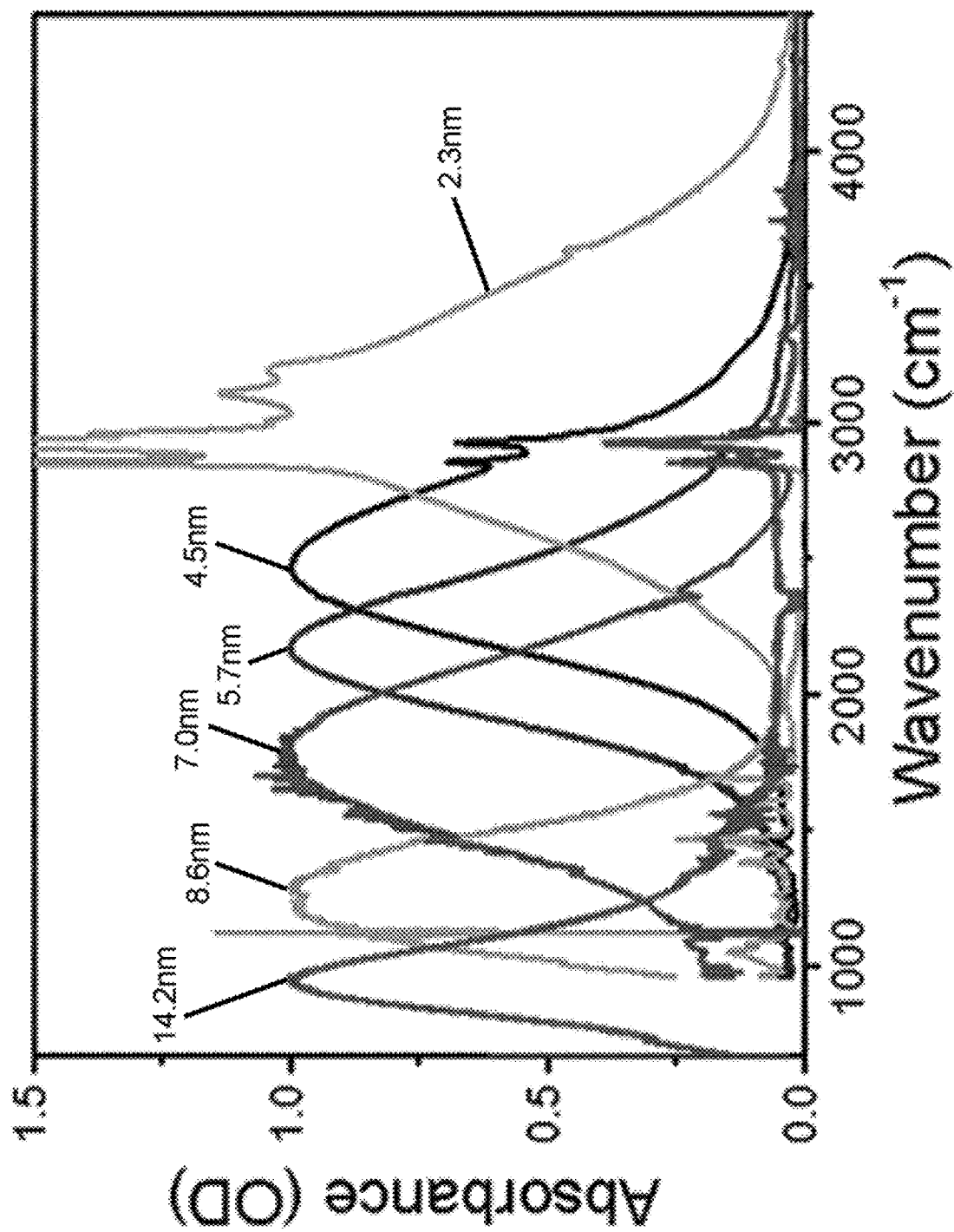
FIG. 9 is a view illustrating an FT-IR absorbance spectrum according to a size of a non-stoichiometric HgS quantum dot according to Examples 1-4, 1-9 to 1-13.

Experimental Example 2. Analysis of Optical Characteristic According to Size of Quantum Dot As illustrated in the FT-IR absorbance spectrum (see FIG. 9) according to the sizes of the non-stoichiometric HgS quantum dots prepared by the methods of Examples 1-4, 1-9 to 1-13, all the non-stoichiometric HgS quantum dots absorb light in the mid-infrared region or far-infrared region and as the average size of the quantum dots is larger, the absorbance spectrum exhibited a smaller wavenumber. Further, in the case of a quantum dot having an average size of 18.2 nm, an absorbance spectrum was approximately 800 to 1100 $cm^{-1}$ and in the case of a quantum dot having an average size of 5.7 nm, an absorbance spectrum was approximately 2100 to 2400 $cm^{-1}$.

Figure 10:
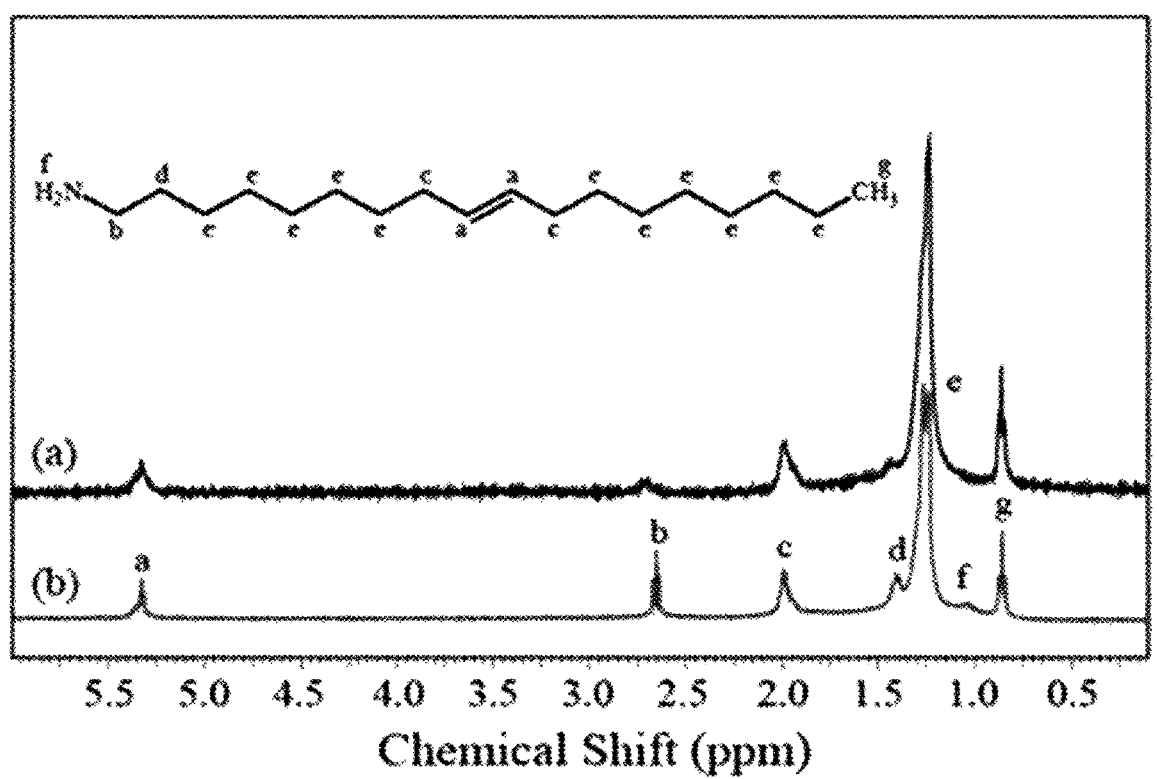
FIG. 10 is a view illustrating $^1$H NMR spectrum of (a) an oleylamine ligand bonded to a non-stoichiometric HgS quantum dot prepared by the method of Example 1 and (b) oleylamine which is not bonded to the non-stoichiometric HgS quantum dot.

Experimental Example 3. Analysis of Crystallographic Characteristic According to Size of Quantum Dot FIG. 10A illustrates a $^1$H NMR spectrum of an oleylamine ligand bonded to a non-stoichiometric HgS quantum dot when the quantum dots were prepared by the method of Example 1 and FIG. 10B illustrates a $^1$H NMR spectrum of an oleylamine ligand which is not bonded to a non-stoichiometric HgS quantum dot.

Figure 11:
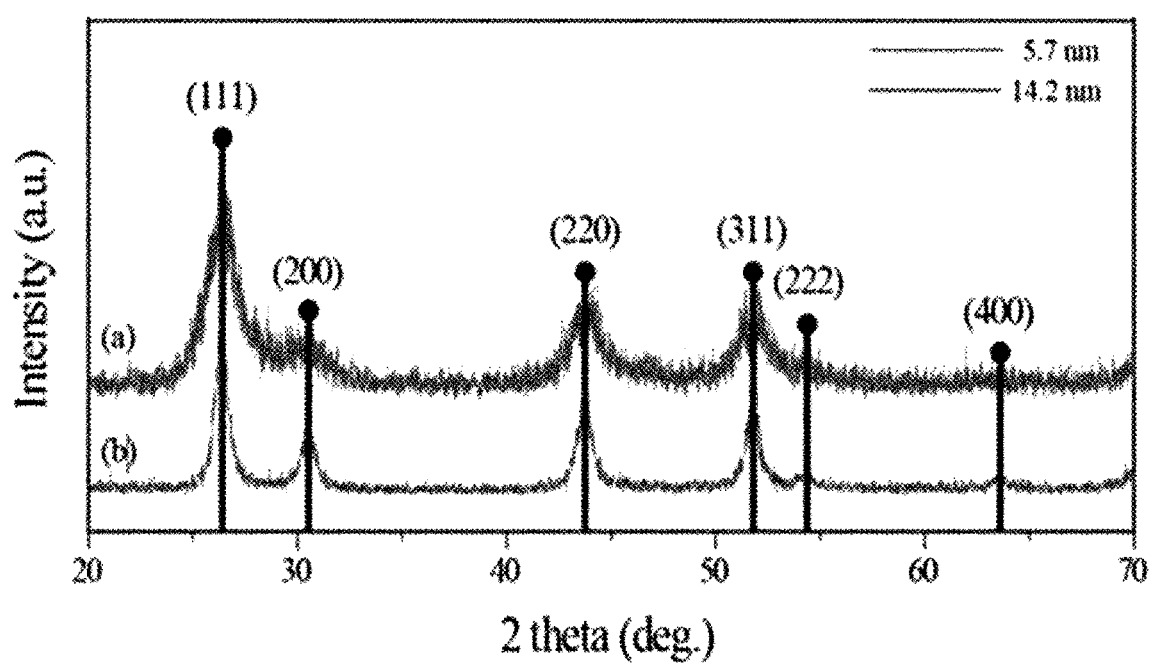
FIG. 11 is a view illustrating an X-ray diffraction (XRD) spectrum of non-stoichiometric HgS quantum dots having average sizes of (a) 5.7 nm and (b) 14.2 nm prepared by the method of Examples 1-4 and 1-13.

As illustrated in the X-ray diffraction (XRD) spectrum (see FIG. 11) of the non-stoichiometric HgS quantum dots having an average size of (a) 5.7 nm and (b) 14.2 nm prepared by the methods of Examples 1-4 and 1-13, all the non-stoichiometric HgS quantum dots having the average sizes of 5.7 nm and 14.2 nm show crystallinity. Therefore, it is understood that the crystallinity of the quantum dot having a larger average size is clearer than the crystallinity of the quantum dot having a smaller average size.

An atomic content ratio of the quantum dots prepared by the method of Example 1 was measured by using a PHI X-tool system (ULVAC-PHI) and an X-ray photoelectron spectroscopy (XPS) using monochromatic Al Kα X-ray as an excitation source.

Figure 12:
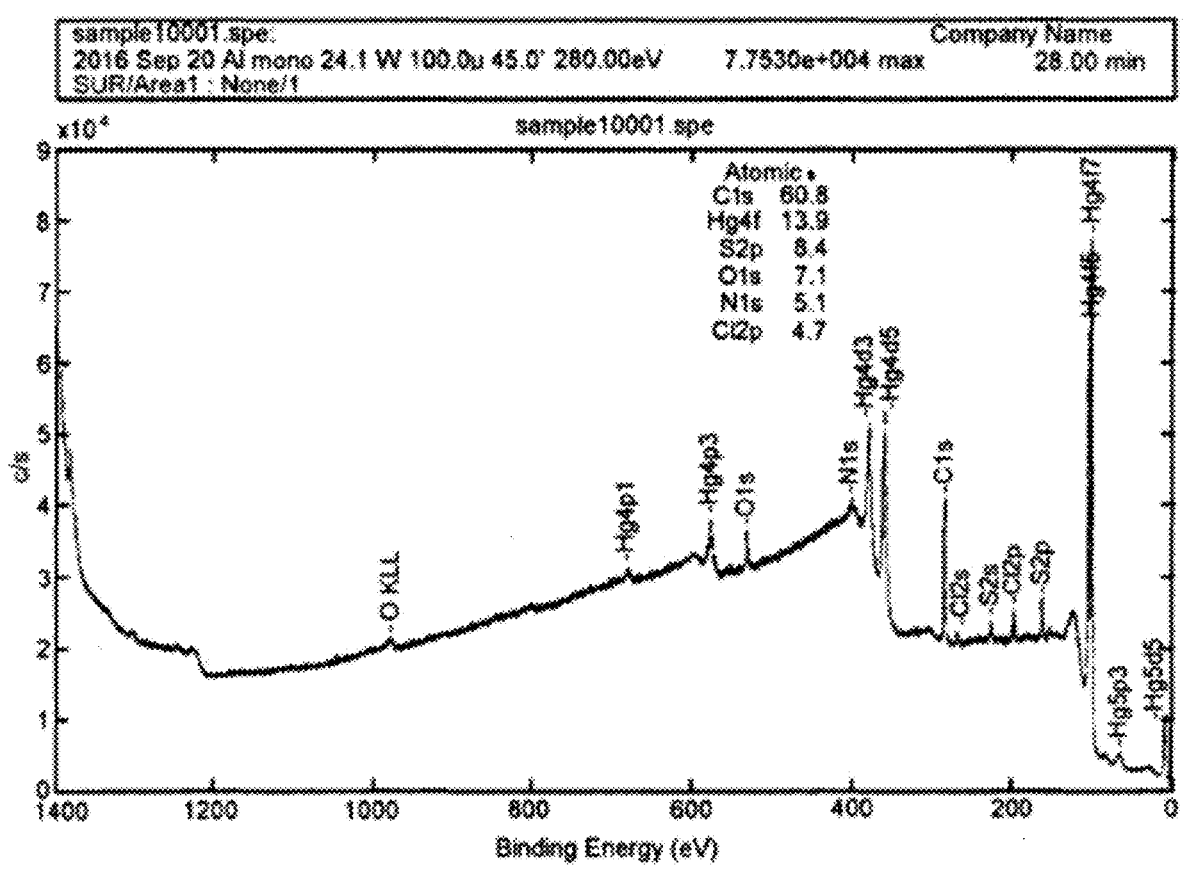
FIG. 12 is a view illustrating Hg:S component proportion analysis of non-stoichiometric HgS quantum dots having an average size of 2.3 nm prepared by a method of Example 1-14 using an X-ray photoelectron spectroscopy (XPS).

It was confirmed that the atomic content of Hg in the element constituting the non-stoichiometric HgS quantum dot having the average size of 2.3 nm prepared by the method of Example 1-14 was 1.65 times higher than the atomic content of S. (see FIG. 12).

Figure 13:
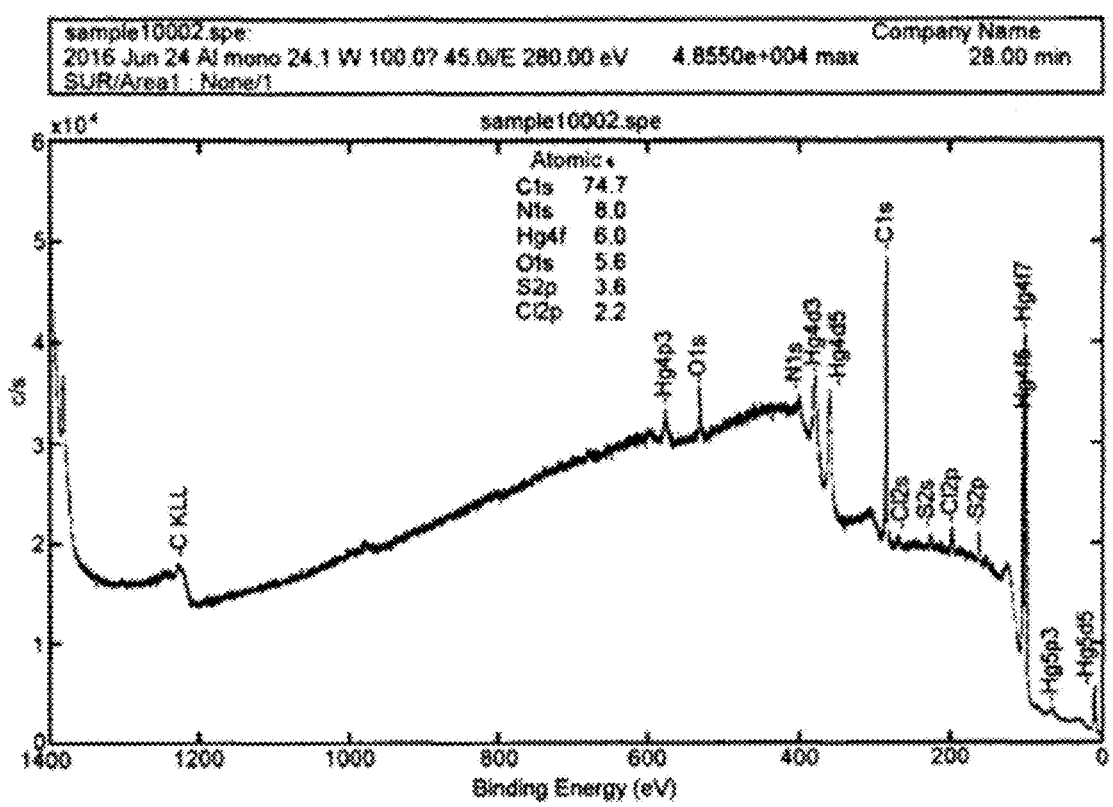
FIG. 13 is a view illustrating Hg:S component proportion analysis of non-stoichiometric HgS quantum dots having an average size of 4.5 nm prepared by a method of Example 1-15 using an XPS.
Figure 14:
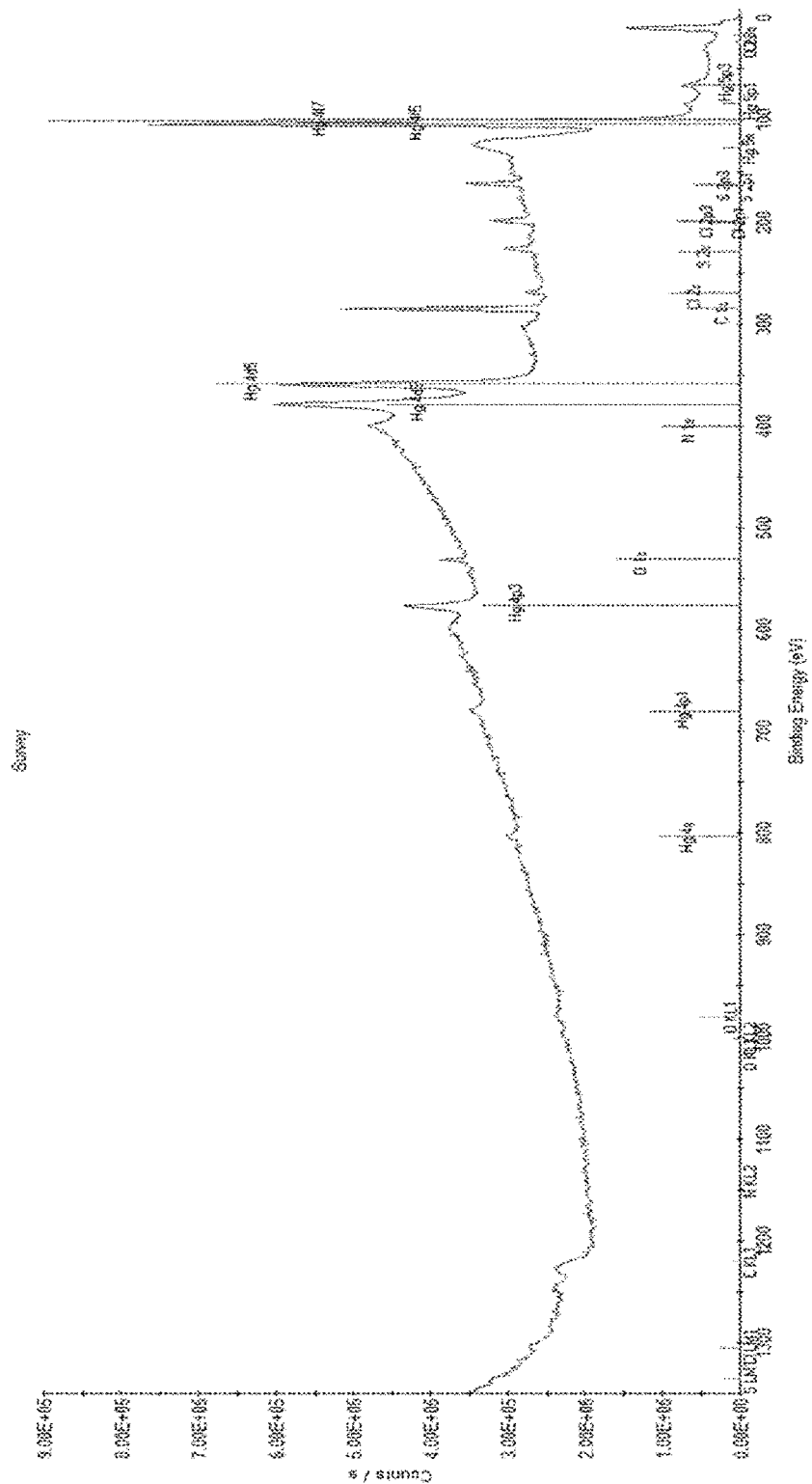
FIG. 14 is a view illustrating Hg:S component proportion analysis of non-stoichiometric HgS quantum dots having an average size of 4.5 nm prepared by a method of Example 1-16 using an XPS.

Further, it was confirmed that the atomic content of 1-Ig of the non-stoichiometric HgS quantum dot having the average size of 4.5 nm prepared by the method of Examples 1-15 and 1-16 was 1.56 to 1.67 times higher than the atomic content of S. (see FIGS. 13 and 14).

Figure 15:
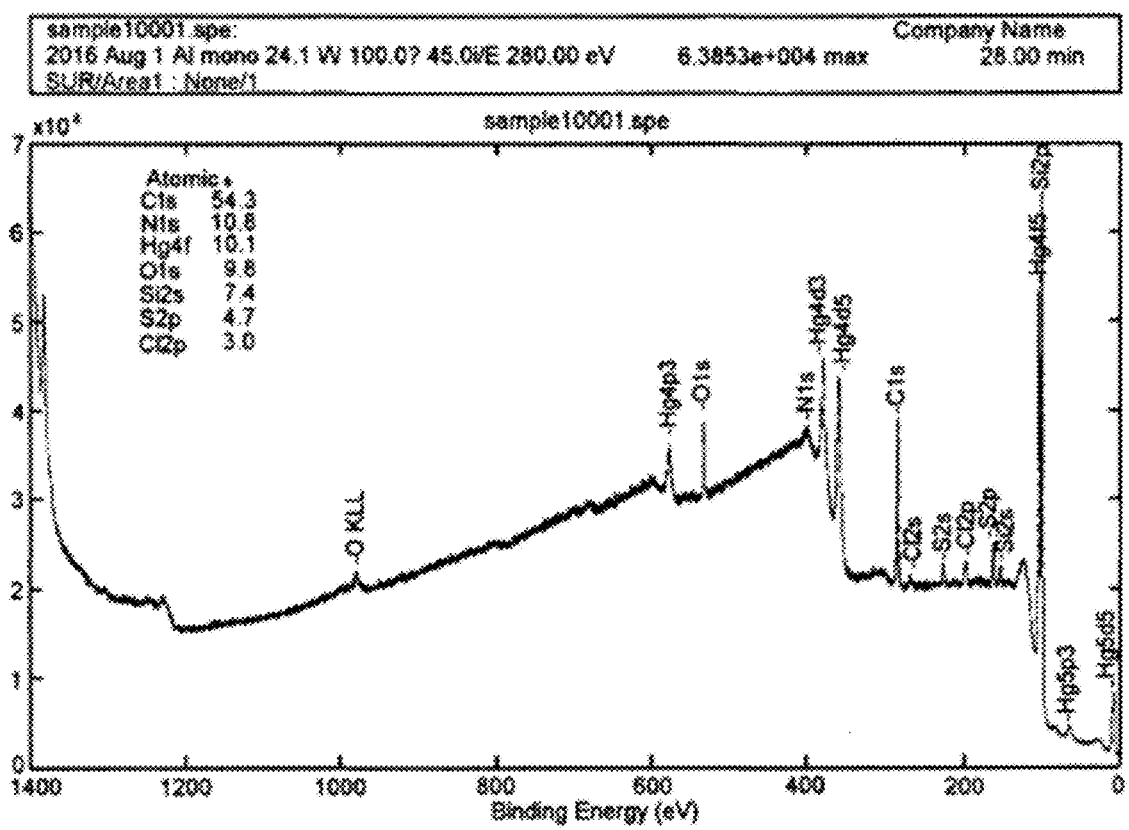
FIG. 15 is a view illustrating Hg:S component proportion analysis of non-stoichiometric HgS quantum dots having an average size of 4.9 nm prepared by a method of Example 1-17 using an XPS.

Further, it was confirmed that the atomic content of Hg of the non-stoichiometric HgS quantum dot having the average size of 4.9 nm prepared by the method of Example 1-17 was 2.15 times higher than the atomic content of S. (see FIG. 15).

Figure 16:
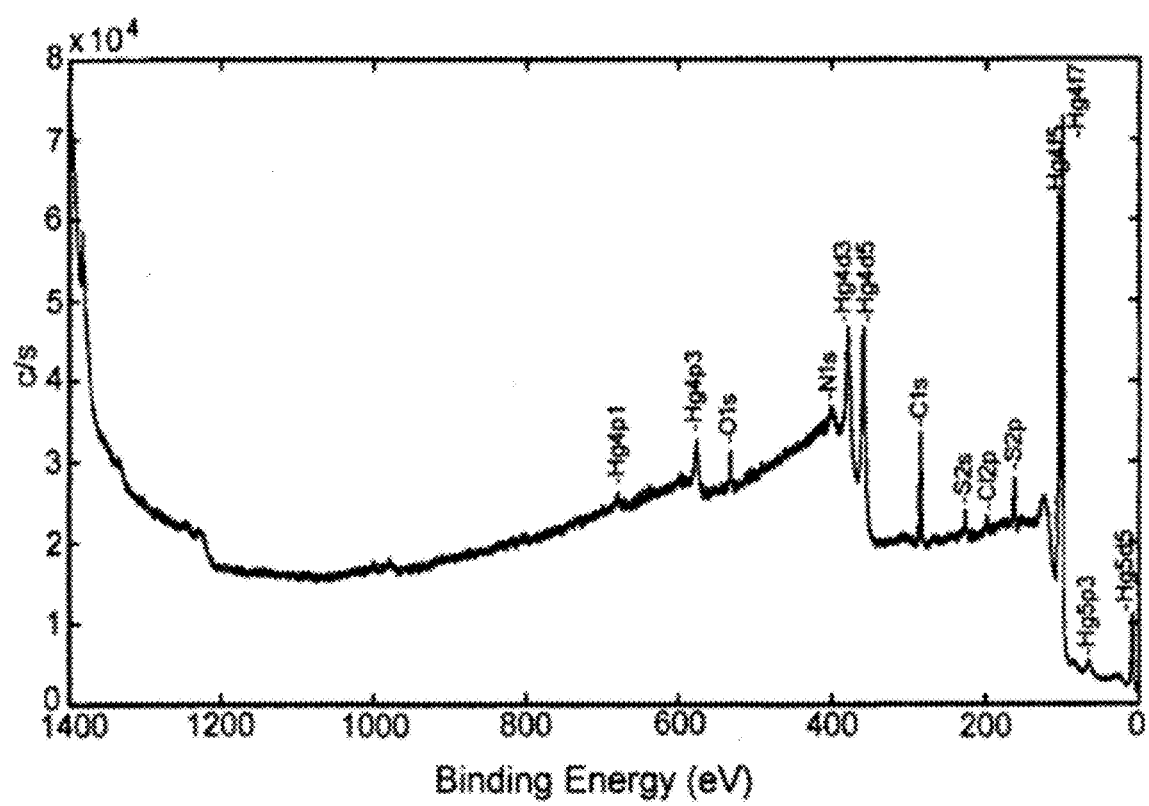
FIG. 16 is a view illustrating Hg:S component proportion analysis of non-stoichiometric HgS quantum dots having an average size of 5.6 nm prepared by a method of Example 1-18 using an XPS.

Further, it was confirmed that the atomic content of Hg of the non-stoichiometric HgS quantum dot having the average size of 5.6 nm prepared by the method of Example 1-18 was 1.44 times higher than the atomic content of S. (see FIG. 16).

Experimental Example 4. Measuring of Infrared Emission of Quantum Dot

Figure 17:
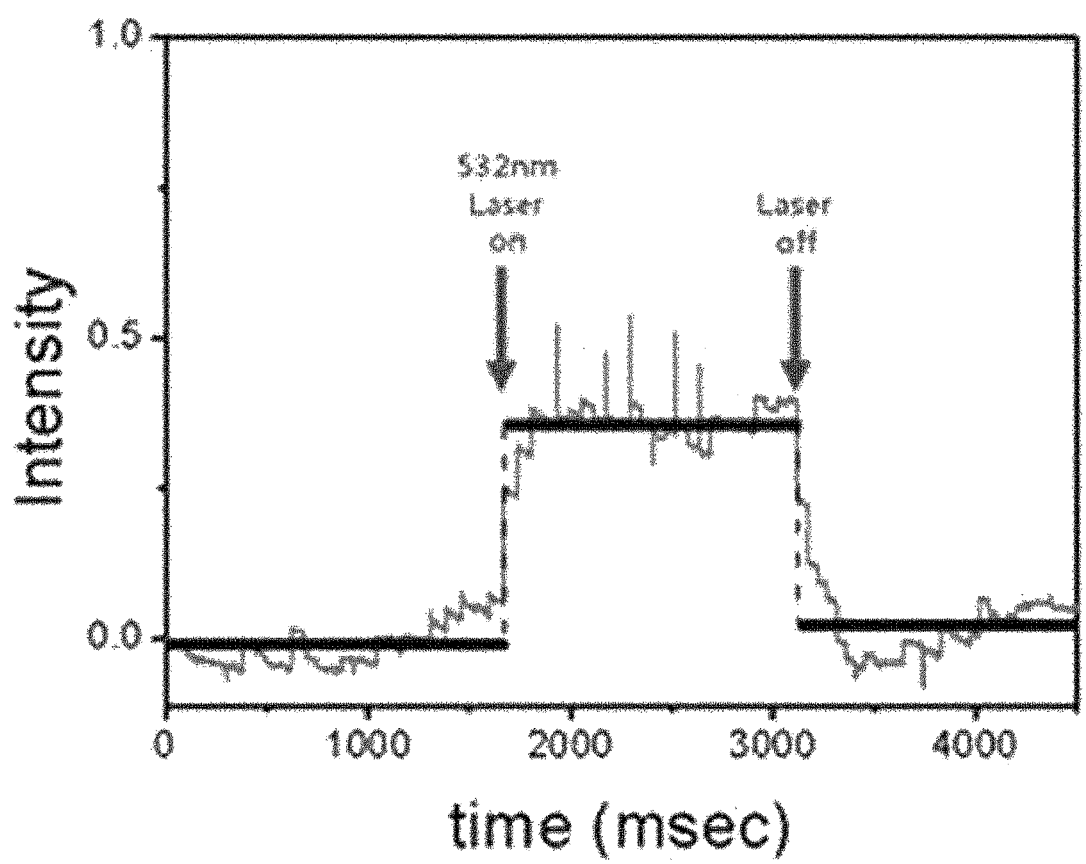
FIG. 17 is a view illustrating an electrical signal of infrared fluorescence generated when a heavily doped non-stoichiometric HgS quantum dot is irradiated with a visible light laser according to a time.
Figure 18:
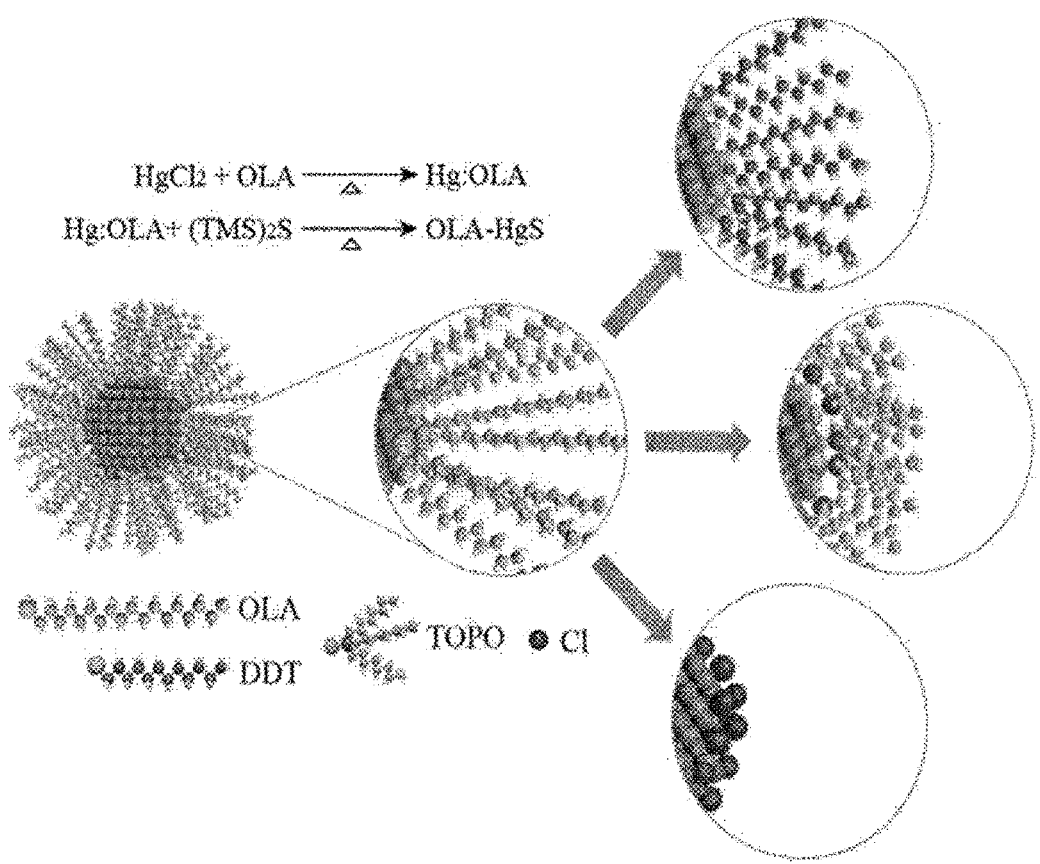
FIG. 18 is a conceptual view illustrating that a quantum dot comprising nonthiol ligand (OLA) is substituted with an organic (TOPO or DDT) or an inorganic (Cl) ligand.

An electric signal of infrared fluorescence of a quantum dot film generated by irradiating a laser light source of a visible ray region to the non-stoichiometric HgS quantum dot prepared by the method of Example 1 was measured using an MCT detector (see FIG. 17). The laser used in this case was 10 Hz, Nd:YAG nano pulse laser (532 nm).

Experimental Example 5. Substitution of Nonthiol Ligand with Another Type of Ligand

Experimental Example 5-1. Substitution of Nonthiol Ligand with Another Type of Organic Ligand The non-stoichiometric HgS quantum dots prepared by the method of Example 1 was stably dispersed in a non-polar solvent. An excess ligand to be substituted was added to the colloidal quantum dot, stirred for about 15 minutes, and the ligand-substituted quantum dots were separated by centrifugation.

Substitutable organic ligands may be oleic acid, mercaptopropionic acid (MPA), cysteamine, mercaptoacetic acid, trioctylphosphine (TOP), trioctylphosphine oxide (TOPO), octylamine, trioctyl amine, hexadecylamine, octanethiol, dodecanethiol, hexylphosphonic acid (HPA), tetradecylphosphonic acid (TDPA), or octylphosphinic acid (OPA) and FTIR and $^1$H NMR after substituting with trioctylphosphine oxide (TOPO) and dodecanethiol were measured and spectra those of were compared (see FIGS. 19 to 22).

Figure 19:
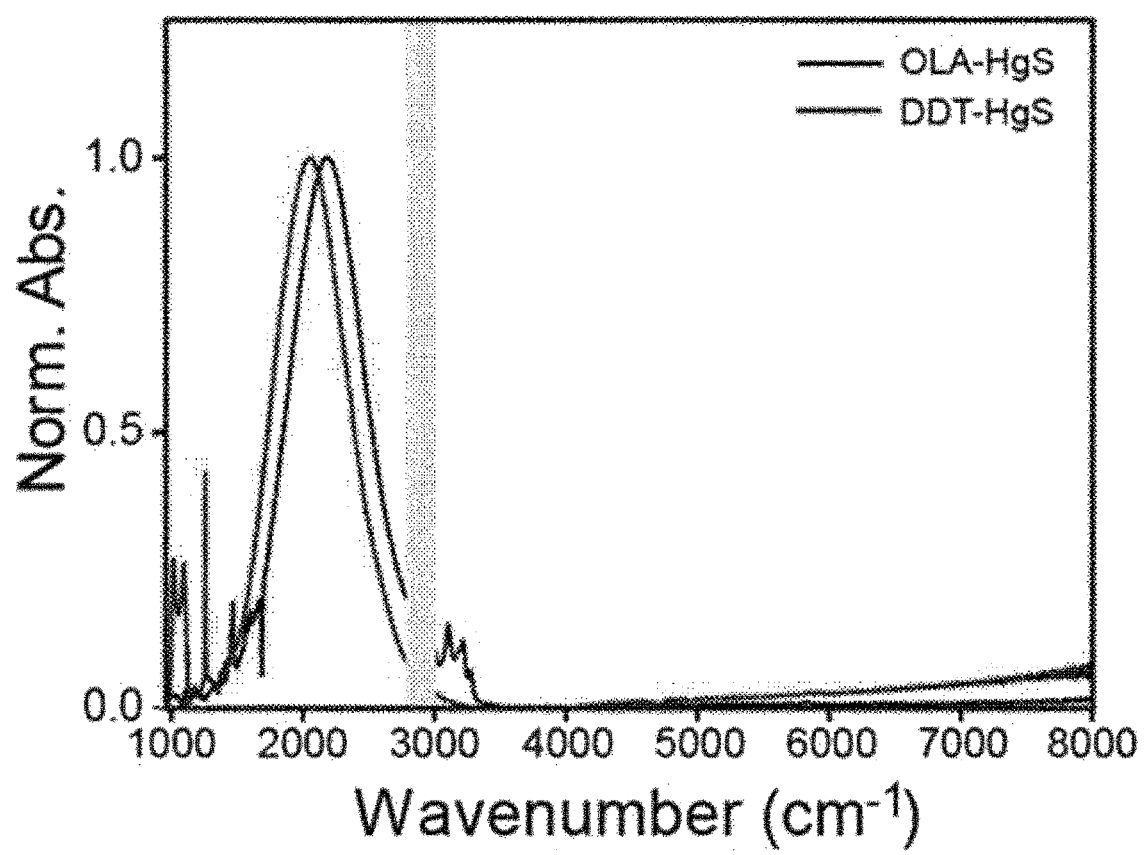
FIG. 19 illustrates an FTIR spectrum when oleylamine (OLA) which is nonthiol ligand is bonded to a non-stoichiometric HgS quantum dot and is substituted with dodecanethiol (DDT) which is an organic ligand, in which a gray area is an area which cannot be measured by a C—H vibration mode.
Figure 20:
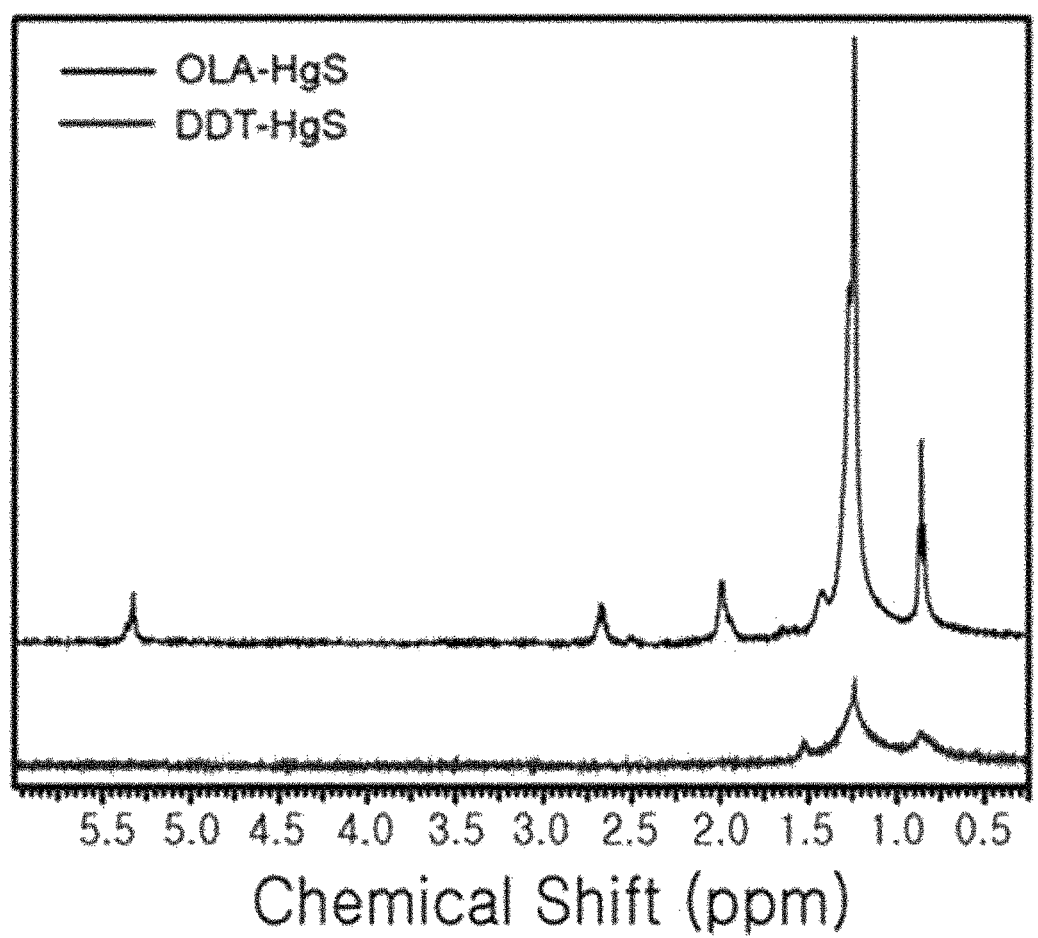
FIG. 20 illustrates a $^1$H NMR spectrum when oleylamine (OLA) which is nonthiol ligand is bonded to a non-stoichiometric HgS quantum dot and is substituted with dodecanethiol (DDT) which is an organic ligand.
Figure 21:
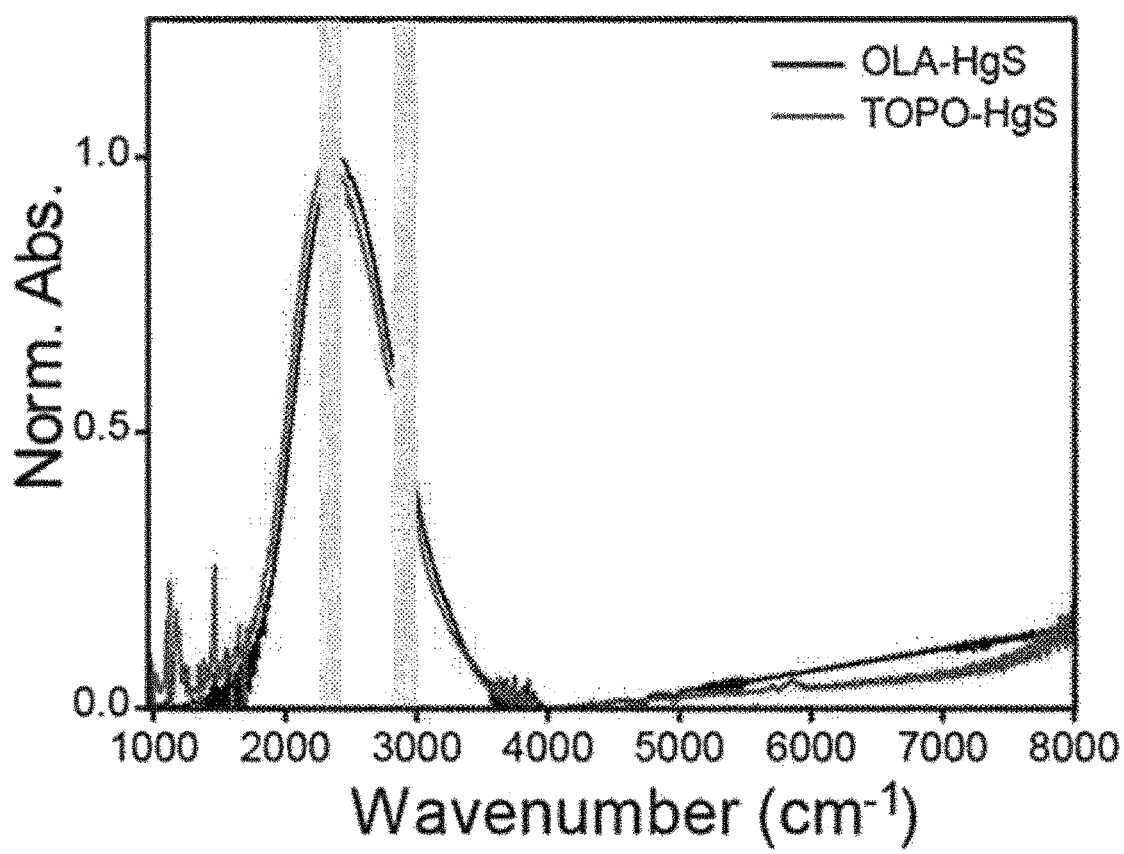
FIG. 21 illustrates an FTIR spectrum when oleylamine (OLA) which is nonthiol ligand is bonded to a non-stoichiometric HgS quantum dot and is substituted with trioctylphosphineoxide (TOPO) which is an organic ligand, in which a gray area is an area which cannot be measured by a carbon dioxide and C—H vibration mode in the atmosphere.
Figure 22:
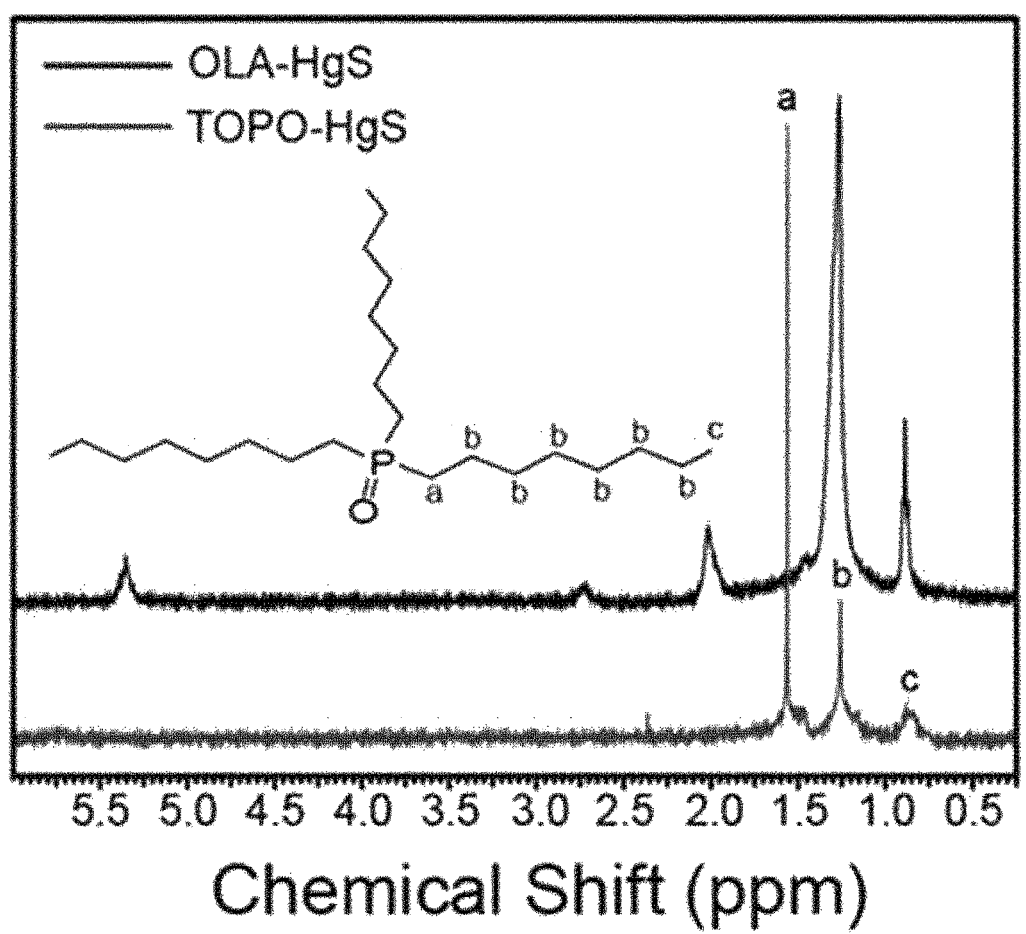
FIG. 22 illustrates a $^1$H NMR spectrum when oleylamine (OLA) which is nonthiol ligand is bonded to a non-stoichiometric non-stoichiometric HgS quantum dot and is substituted with trioctylphosphineoxide (TOPO) which is an organic ligand.

In FIGS. 19 to 21, the heavily doping was maintained even after ligand substitution to exhibit absorption in a mid-infrared region so that it was confirmed that the ligand substitution of the quantum dot of the nonthiol ligand was easier than the thiol ligand of the related art in which the ligand substation was hard. The gray area of FIGS. 19 to 21 illustrate an area corresponding to a C—H vibration mode of carbon dioxide and the ligand.

Experimental Example 5-2. Substitution of Nonthiol Ligand with Another Type of Inorganic Ligand The non-stoichiometric HgS quantum dots prepared by the method of Example 1 were stably dispersed in a non-polar solvent. Thereafter, an excess of the inorganic ligand to be substituted was added to a polar solvent (n-methylformamide solution and deionized water) and then stirred with the non-polar solvent phase for 15 minutes to 1 day. After the quantum dots present in the nonpolar solvent were shifted to the polar solvent phase, stirring was stopped and the quantum dots were separated by centrifugation.

Figure 23:
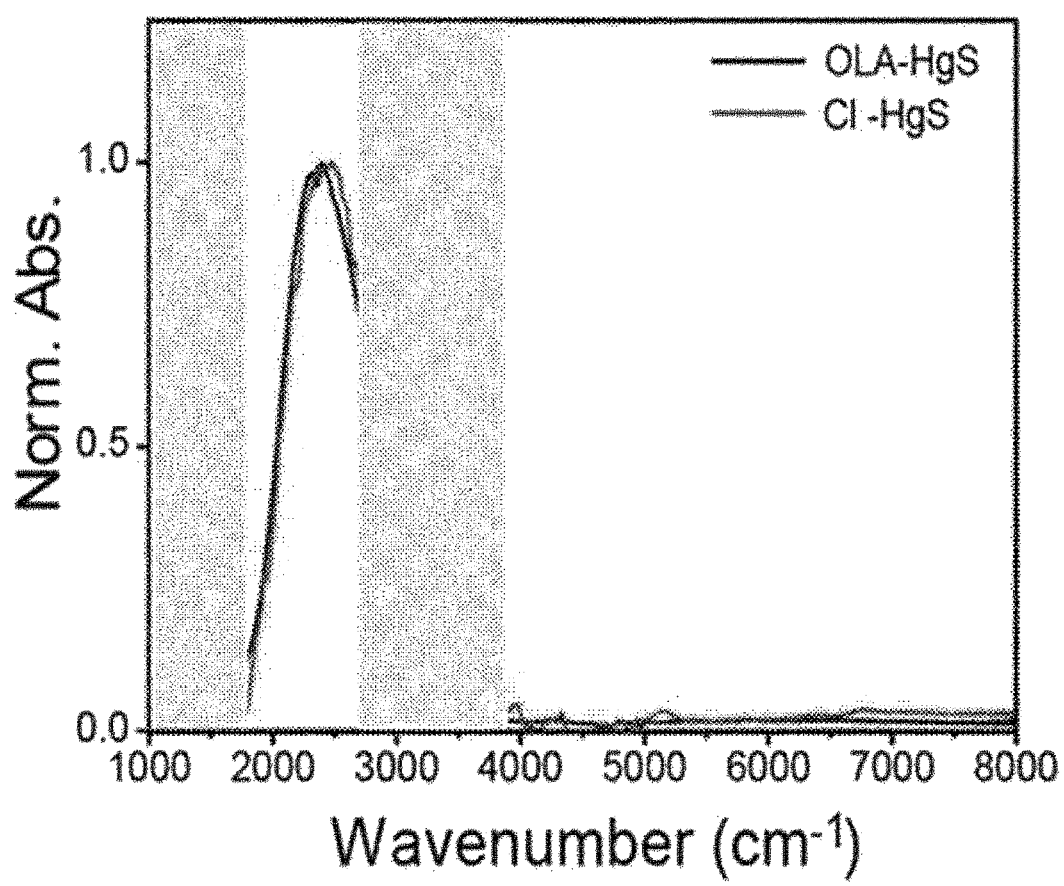
FIG. 23 illustrates an FTIR spectrum when oleylamine (OLA) which is nonthiol ligand is bonded to a non-stoichiometric HgS quantum dot and is substituted with chlorine (Cl) which is an inorganic ligand, in which a gray area is an area which cannot be measured by absorption of N-methylformamide (NMF) which is a polar solvent.
Figure 24:
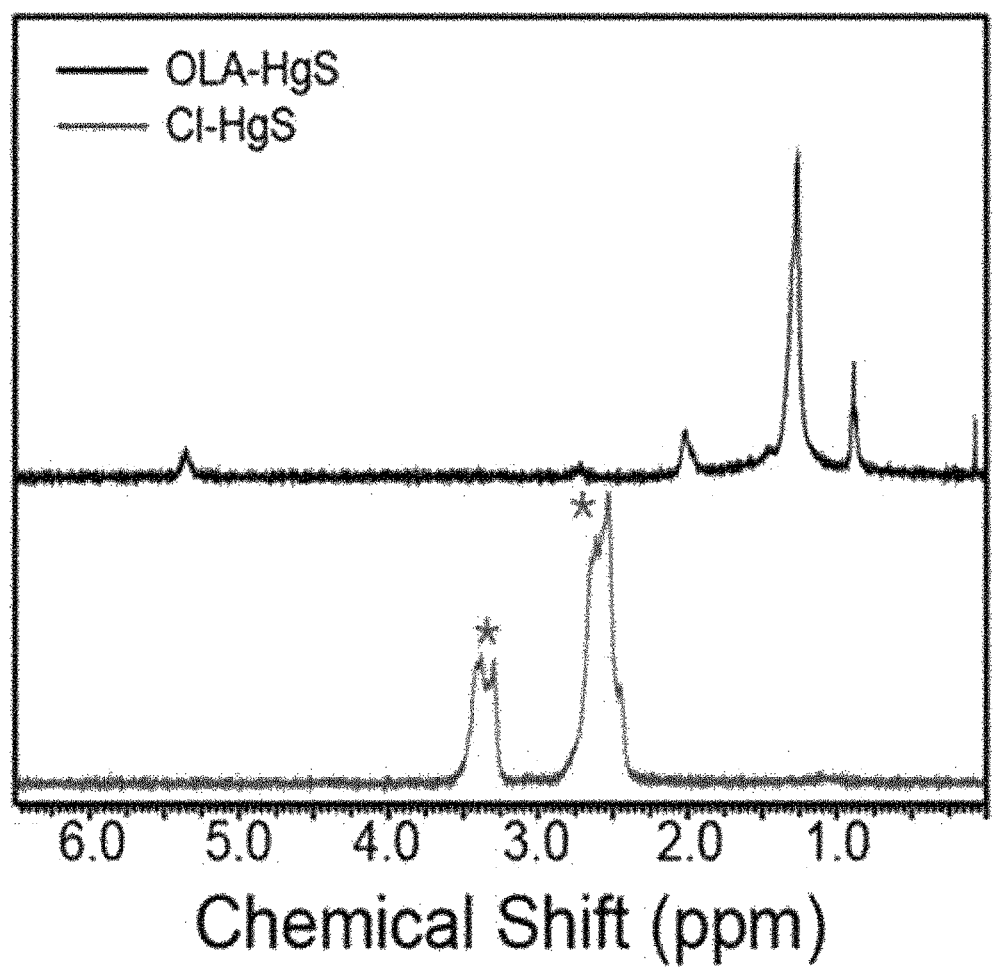
FIG. 24 illustrates a $^1$H NMR spectrum when oleylamine (OLA) which is nonthiol ligands is bonded to a non-stoichiometric HgS quantum dot and is substituted with chlorine (Cl) which is an inorganic ligand, in which * is a signal by a solvent (DMSO, water).

A substitutable inorganic ligand may be a halogenide (Cl—, Br—, I—) and a cyanide (SCN—), hu the FUR and $^1$H NMR after substitution with chloride ion (Cl$^-$) were measured to compare spectra those of (See FIGS. 23 and 24).

Figure 25:
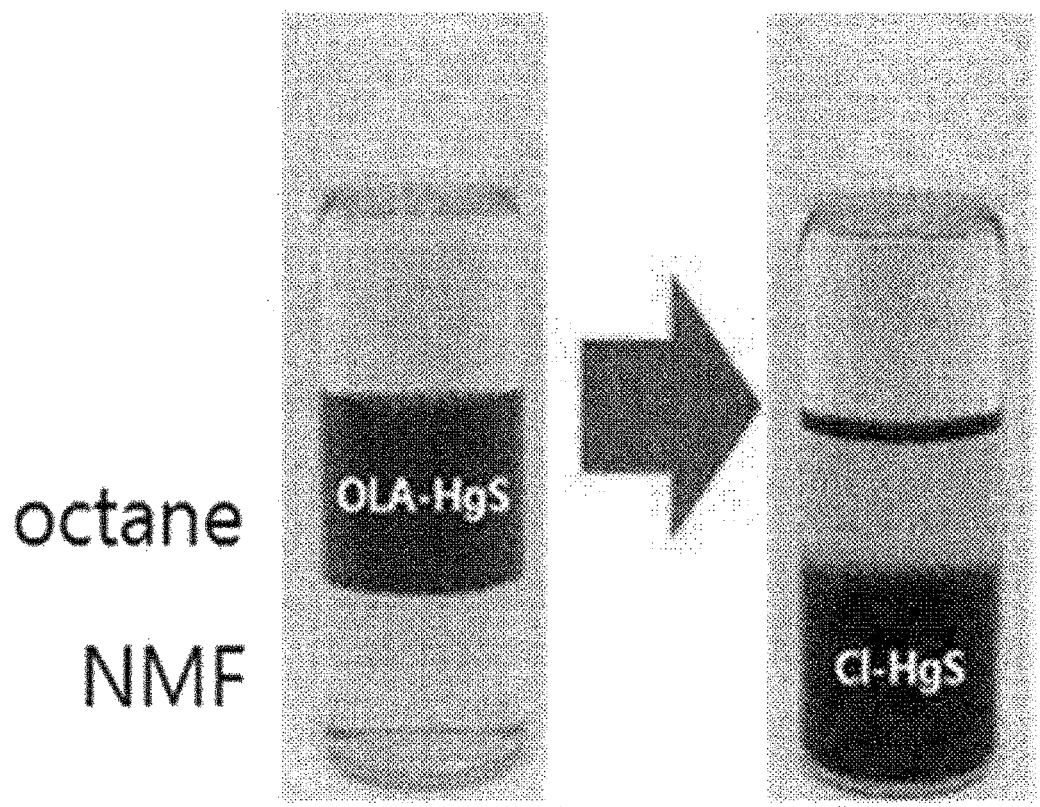
FIG. 25 is a view illustrating a process that the non-stoichiometric HgS quantum dot bonded to oleylamine which is dispersed in a non-polar solvent (octane) is substituted with chlorine which is an inorganic ligand to be shifted to a polar solvent.

It was confirmed that the nonthiol ligand HgS quantum dots (non-stoichiometric) dispersed in the non-polar solvent (octane) were phase-shifted to a polar solvent (NMF) by the inorganic ligand substation (see FIG. 25). This represents that when the nonthiol ligand is bonded to the quantum dots, the ligand substitution of the ligand of the quantum dots was easier than that of the thiol ligand of the related art. A gray area of FIG. 23 is an area which cannot be measured by absorption of N-methylformamide (NMF) which is a polar solvent.

Experimental Example 6. Adjustment of Doping of Heavily Doped HgS Film

After forming a quantum dot film by heavily doping the non-stoichiometric HgS quantum dots prepared by the method of Example 1 on a CaF$_2$ or ZnS, or ZnSe window, 2% solution of ammonium sulfide was applied on a partial area of the surface of the film to remove the heavy doping and measured with an optical microscope (see FIG. 26A) and an FTIR microscope (see FIG. 26B).

Figure 26:
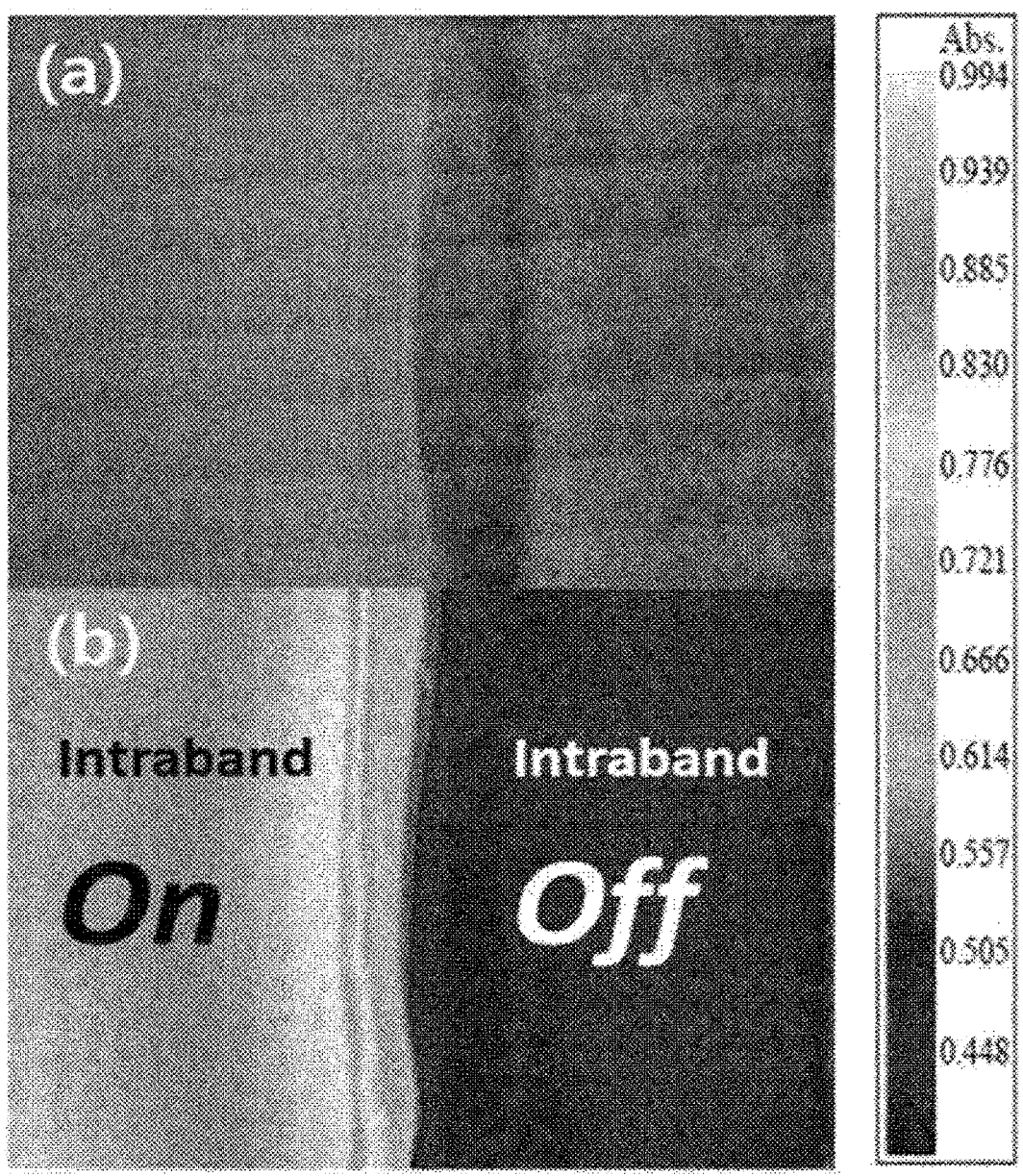
FIG. 26 is images of an optical microscope (a) and an FTIR microscope (b) when a heavily doped non-stoichiometric HgS quantum dot film surface is treated with $S^{2-}$ ion (right) and is not treated with $S^{2-}$ ion (left).

In FIG. 26, a proportion of chalcogen was locally higher than the metal so that the heavy doping was removed. Therefore, the band gap transition ($1S_e$-$1P_e$) was restored to be a PN junction like structure formed of a single material.

Experimental Example 7. Measurement of $1P_e$-$1D_e$ Upper-Level Transition of Heavily Doped HgS Film As electrons fill the upper level of the quantum dots, the characteristic of the quantum dots become more similar to the metal plasmons. Therefore, the change between the semiconductor and the metal in the nanomaterial may be measured optically (FTIR) and magnetically (EPR).

The change between the semiconductor and the metal in the nanomaterial was measured while filling electron doping in the non-stoichiometric HgS quantum dots prepared by the method of Example 1. Upper-level electron transition ($1P_e$-$1D_e$) of the heavily doped non-stoichiometric HgS quantum dot was observed by consistently irradiating infrared rays on a nonthiol ligand quantum dot film formed on a surface of gold Au.

Figure 27:
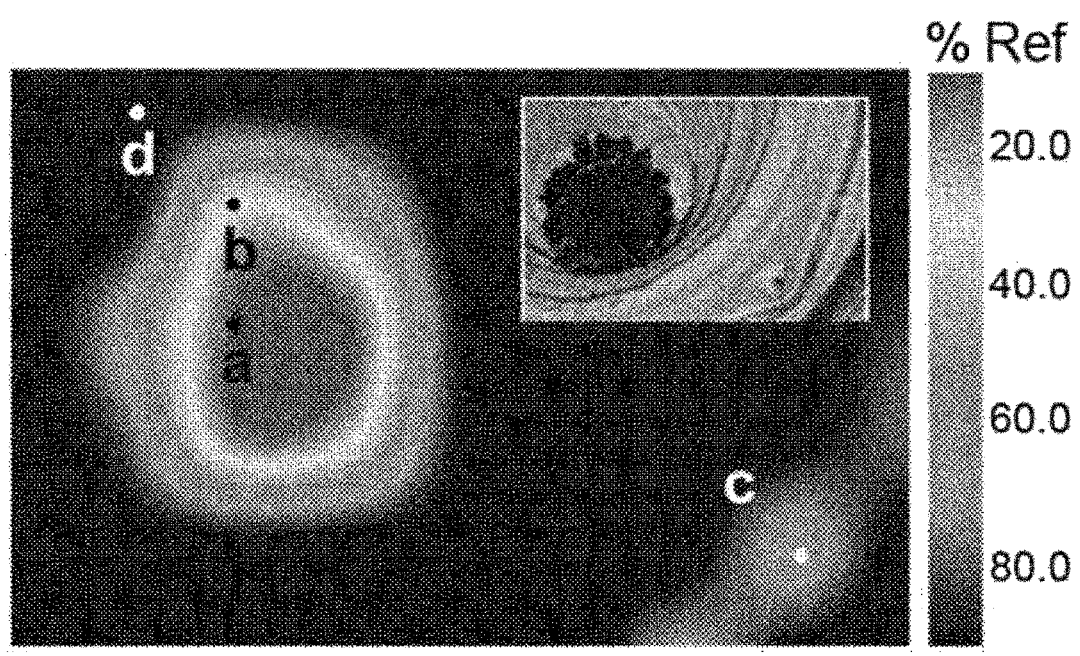
FIG. 27 is an FTIR microscope image of a heavily doped nonthiol ligand HgS quantum dot (non-stoichiometric) and the illustration is an optical microscope image.
Figure 28:
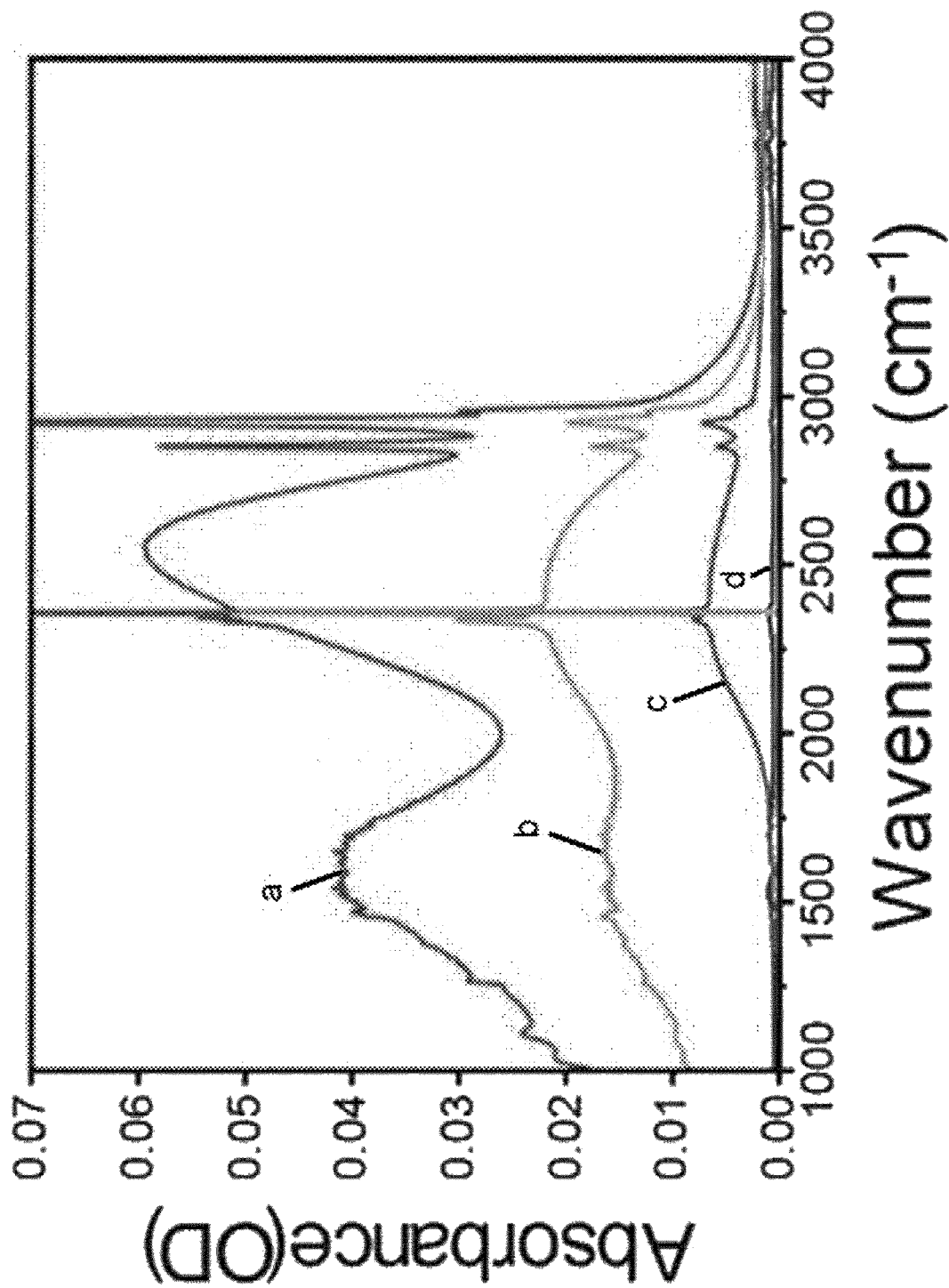
FIG. 28 is a view illustrating an FTIR spectrum showing a process that $1S_e$-$1P_e$ (S-P) electron transition and upper-level $1P_e$-$1D_e$ (P-D) electron transition are generated depending on a thickness of a quantum dot film.
Figure 29:
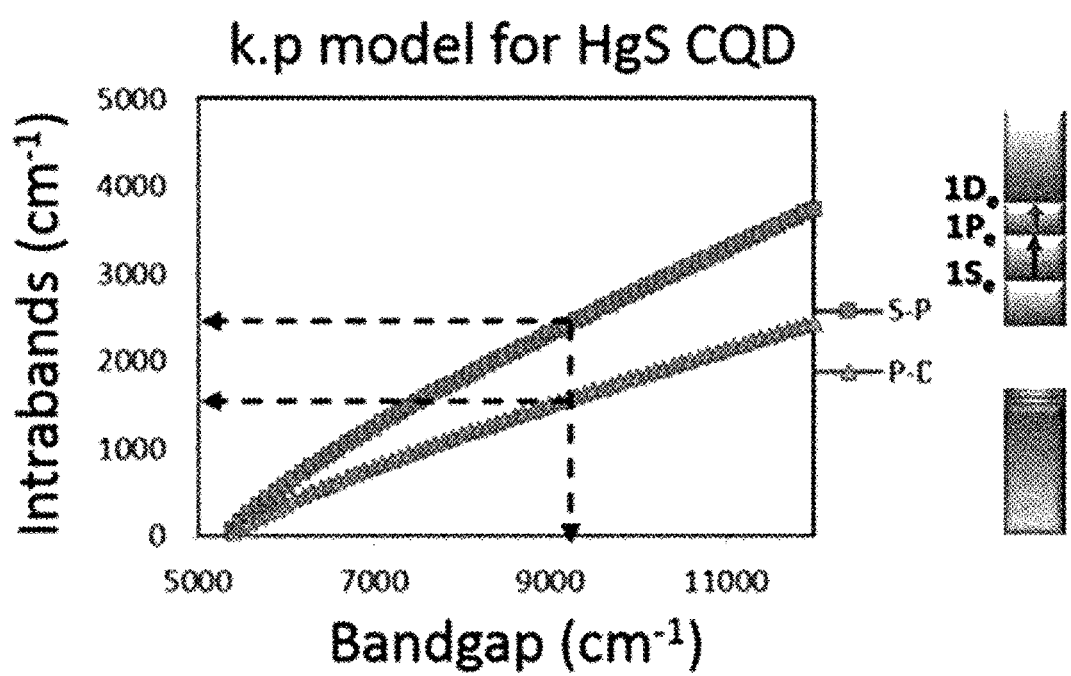
FIG. 29 is a view illustrating S-P, P-D transition energy prediction of band gap transition ($1S_h$-$1S_e$) using k.p model.

It was confirmed that an upper-level P-D transition may be formed in accordance with the thickness of the film through the optical microscope image (see illustration of FIG. 27), the FTIR microscope image (see FIG. 27), and spectra thoseof (see FIG. 28). It was confirmed that S-P, P-D transition energy for band gap transition ($1S_h$-$1S_e$) matches the experimental result using k.p model (see FIG. 29).

Figure 30:
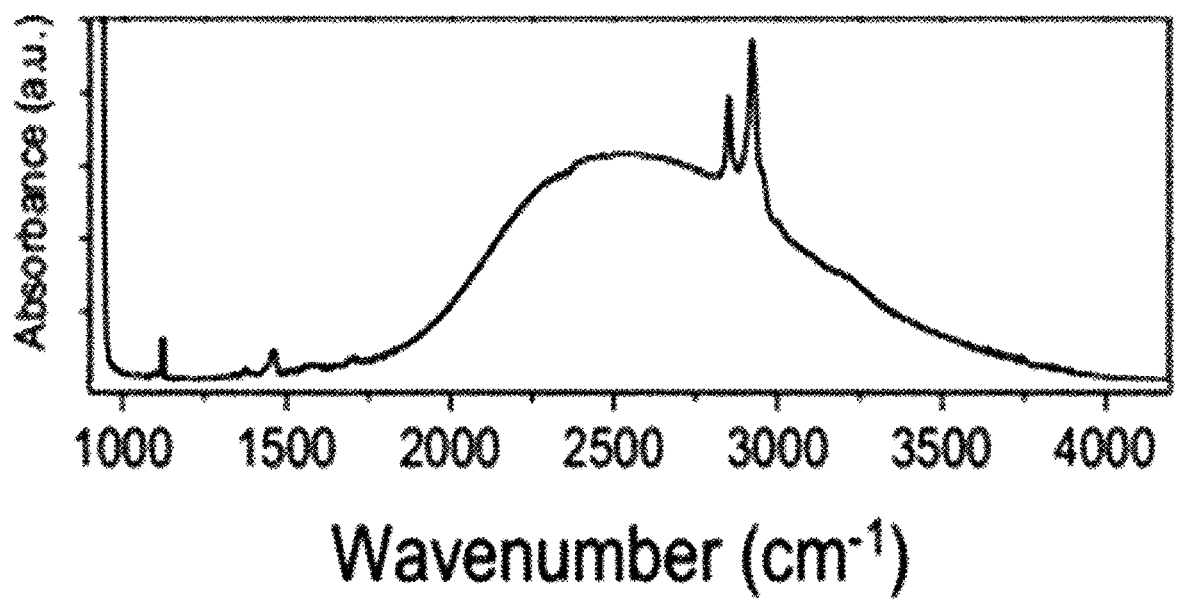
FIG. 30 is a view illustrating an infrared absorbance spectrum of non-stoichiometric colloidal quantum dots to which a voltage is not applied.

Experimental Example 8. Quantum Dot in-Band Transition Infrared Device which Adjusts Transmittance of Specific Wavelength Reversible change of the specific wavelength transmittance was measured by applying various voltages to the device manufactured by the method of Example 4. FIG. 30 is a view illustrating an infrared absorbance spectrum of a colloidal non-stoichiometric HgS quantum dots to which a voltage is not applied.

Figure 31:
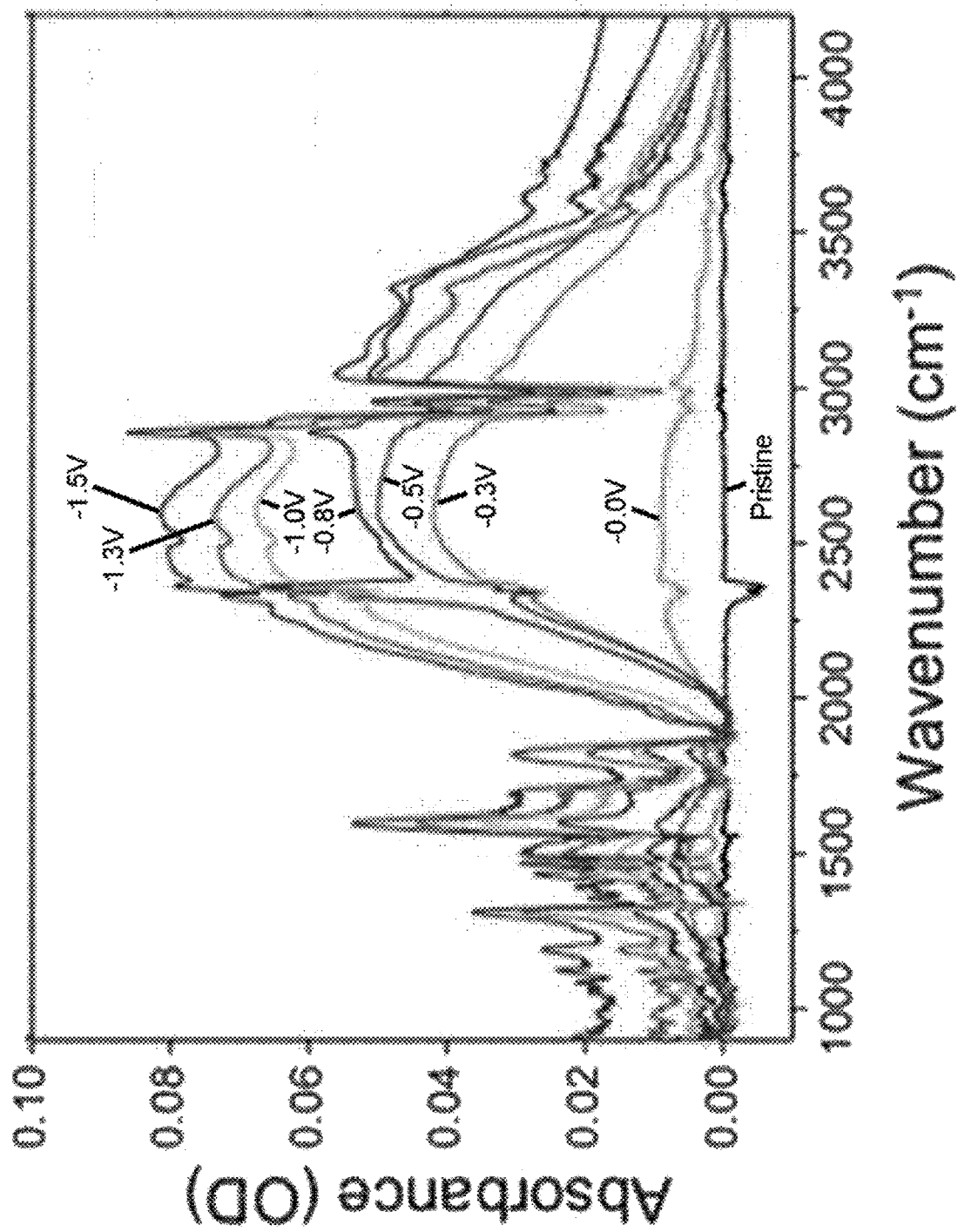
FIG. 31 is a view illustrating an infrared absorbance spectrum of non-stoichiometric colloidal quantum dots by applying a negative voltage by an infrared device using a non-stoichiometric HgS quantum dot prepared by a method of Example 4.
Figure 32:
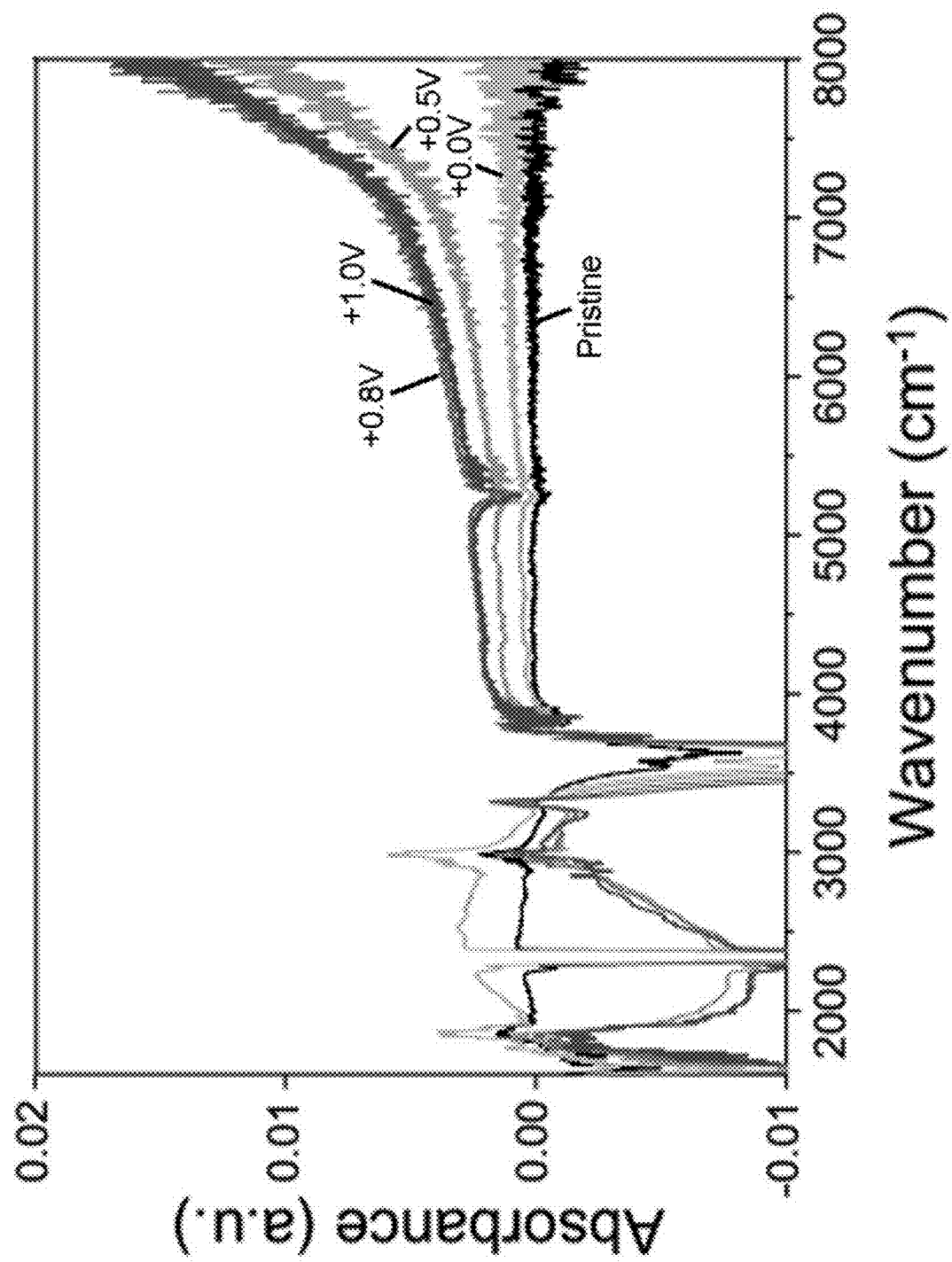
FIG. 32 is a view illustrating an infrared absorbance spectrum of non-stoichiometric colloidal quantum dots by applying a positive voltage using an infrared device using a non-stoichiometric HgS quantum dot prepared by a method of Example 4.

When a negative voltage of 0 to −1.5 V was applied to the quantum dot film, the transmittance near 2500 cm$^{-1}$ of the absorbance spectrum was lowered and shifted to a low wavelength region (see FIG. 31). When a positive voltage of 0 to +1.0V was applied to the quantum dot film, the transmittance near 2500 cm$^{-1}$ of the absorbance spectrum was increased and shifted to a high wavelength region (see FIG. 32). By doing this, it was confirmed that when the voltage is changed, specific wavelength transmittance is reversibly changed.

As described above, the present invention has been described through Examples. It will be appreciated by those skilled in the art that the present invention as described above may be implemented into other specific forms without departing from the technical spirit thereof or essential characteristics. Therefore, it should be understood that the above-described examples are illustrative, but are not restrictive in all respects. The scope of the present invention is represented by the claims to be described below rather than the detailed description, and it is to be interpreted that the meaning and scope of the claims and all the changes or modified forms derived from the equivalents thereof come within the scope of the present invention.

The invention claimed is:

1. Non-stoichiometric quantum dot nanoparticles comprising quantum dot cores and nonthiol ligands bonded to the core,
   wherein infrared rays are emitted from electron transition between discrete energy levels in a band,
   wherein the quantum dot core is a mercury-chalcogen nanocrystal, and
   wherein the mercury of the nanocrystal is composed of an atomic ratio of 1 to 10 with respect to one chalcogen.

2. The non-stoichiometric quantum dot nanoparticles of claim 1, wherein the nonthiol ligand is bonded to 1 mol of the core at a molar ratio of 1 to 100.

3. The non-stoichiometric quantum dot nanoparticles of claim 1, wherein the energy level of the quantum dot is a S, P, or D level.

4. The non-stoichiometric quantum dot nanoparticles of claim 1, wherein the quantum dot has an average diameter of 1 to 20 nm.

5. The non-stoichiometric quantum dot nanoparticles of claim 1, wherein the larger the size of the quantum dot is, the smaller wavenumber of the infrared rays is emitted.

6. The non-stoichiometric quantum dot nanoparticles of claim 1, wherein the infrared ray is a mid-infrared ray or a far-infrared ray.

7. The non-stoichiometric quantum dot nanoparticles of claim 1, wherein the quantum dot core is one or more selected from the group consisting of non-steroichemertic HgS, non-steroichemertic HgSe, non-steroichemertic HgTe, non-steroichemertic HgSeS, non-steroichemertic HgSeTe, and non-steroichemertic HgSTe.

8. The non-stoichiometric quantum dot nanoparticles of claim 1, wherein the nonthiol ligand is one or more selected from a group consisting of oleic acid, oleylamine, trioctylphosphine (TOP), trioctylphosphine oxide (TOPO), octylamine, trioctyl amine, hexadecylamine, hexylphosphonic acid (HPA), tetradecylphosphonic acid (TDPA), and octylphosphinic acid (OPA).

9. A producing method of non-stoichiometric colloidal quantum dot nanoparticles, comprising:
   (1) preparing a mercury (Hg) precursor solution by heating a mixture of a mercury (Hg) precursor and nonthiol ligands to 100 to 150° C.; and
   (2) mixing the mercury (Hg) precursor solution and a chalcogen precursor solution, followed by heating to 40 to 120° C.

10. The producing method of claim 9, further comprising: irradiating light to the colloidal quantum dot.

11. The producing method of claim 9, wherein in step (1), the nonthiol ligands are used at a molar ratio of 1 to 100 per 1 mol of mercury (Hg).

12. The producing method of claim 9, wherein in step (2), a solvent of the chalcogen precursor solution is one or more selected from a group consisting of octadecene, octadecylamine, hexadecene, pentadecene, tetradecene, octadecadiene, hexadecadiene, tetradecadiene, phenylether, diphenyl, paraffin, oleic acid, and hexadecane.

13. The producing method of claim 9, wherein in step (2), the mercury (Hg) is added at a molar ratio of 1 to 10 per 1 mol of the chalcogen.

14. An infrared device comprising:
   the non-stoichiometric quantum dot nanoparticles of claim 1.

15. The infrared device of claim 14, wherein the infrared device is an infrared camera, an infrared detector, an infrared therapy device, an infrared communication device, an infrared solar cell, an infrared LED, an infrared laser, a gas sensor, or an infrared color filter.

* * * * *